(12) United States Patent
Winkler et al.

(10) Patent No.: US 9,745,511 B2
(45) Date of Patent: Aug. 29, 2017

(54) PHOSPHORS

(71) Applicant: MERCK PATENT GMBH, Darmstadt (DE)

(72) Inventors: Holger Winkler, Darmstadt (DE); Thomas Juestel, Witten (DE); Arturas Katelnikovas, Steinfurt (DE); Tobias Dierkes, Muenster (DE)

(73) Assignee: MERCK PATENT GMBH, Darmstadt (DE)

( * ) Notice: Subject to any disclaimer, the term of this patent is extended or adjusted under 35 U.S.C. 154(b) by 0 days.

(21) Appl. No.: 14/909,760

(22) PCT Filed: Jul. 9, 2014

(86) PCT No.: PCT/EP2014/001881
§ 371 (c)(1),
(2) Date: Feb. 3, 2016

(87) PCT Pub. No.: WO2015/018474
PCT Pub. Date: Feb. 12, 2015

(65) Prior Publication Data
US 2016/0186056 A1    Jun. 30, 2016

(30) Foreign Application Priority Data
Aug. 8, 2013 (EP) .................... 13003962

(51) Int. Cl.
*H01L 33/00* (2010.01)
*C09K 11/77* (2006.01)
(Continued)

(52) U.S. Cl.
CPC ........ *C09K 11/7792* (2013.01); *H01L 33/502* (2013.01); *H05B 33/14* (2013.01)

(58) Field of Classification Search
CPC ...................................... H01L 33/502
(Continued)

(56) References Cited

U.S. PATENT DOCUMENTS 7,981,321 B2    7/2011    Schmidt et al.
8,546,845 B2    10/2013   Schmidt et al.
(Continued)

FOREIGN PATENT DOCUMENTS

CN    101868515 A    10/2010
CN    103003390 A    3/2013
(Continued)

OTHER PUBLICATIONS

Chinese Office Action dated Dec. 28, 2016 issued in corresponding CN 201480044464.0 application w/English Translation.
(Continued)

*Primary Examiner* — Igwe U Anya
(74) *Attorney, Agent, or Firm* — Millen White Zelano and Branigan, PC

(57) ABSTRACT

The present invention relates to europium-doped phosphors, to a process for the preparation thereof, and to the use of these compounds as conversion phosphors. The present invention furthermore relates to light-emitting devices which comprise the phosphor according to the invention.

20 Claims, 19 Drawing Sheets

(51) Int. Cl.
  *H05B 33/14* (2006.01)
  *H01L 33/50* (2010.01)
(58) Field of Classification Search
  USPC .......................................................... 257/98
  See application file for complete search history.

(56) References Cited

U.S. PATENT DOCUMENTS

| | | | |
|---|---|---|---|
| 9,139,763 | B2 | 9/2015 | Winkler et al. |
| 9,305,970 | B2* | 4/2016 | Horie ........................ F21K 9/00 |
| 2003/0094893 | A1* | 5/2003 | Ellens ................... C04B 35/597 |
| | | | 313/503 |
| 2010/0079058 | A1 | 4/2010 | Schmidt et al. |
| 2010/0244076 | A1* | 9/2010 | Schmidt ............. C09K 11/0883 |
| | | | 257/98 |
| 2010/0259156 | A1 | 10/2010 | Winkler et al. |
| 2011/0304264 | A1 | 12/2011 | Winkler |
| 2012/0019126 | A1 | 1/2012 | Porob et al. |
| 2014/0183578 | A1* | 7/2014 | Horie ........................ F21K 9/00 |
| | | | 257/89 |
| 2014/0217417 | A1* | 8/2014 | Horie ................ H05B 33/0866 |
| | | | 257/76 |

FOREIGN PATENT DOCUMENTS

| | | |
|---|---|---|
| DE | 102006016548 A1 | 10/2006 |
| WO | 2007004138 A2 | 1/2007 |
| WO | 2009072043 A1 | 6/2009 |

OTHER PUBLICATIONS

English Abstract of CN 101868515 A published Oct. 20, 2010.
English Abstract of CN 103003390 A published Mar. 27, 2013.
International Search report dated Sep. 15, 2014 issued in corresponding PCT/EP2014/001881 application (pp. 1-3).
T. Kurushima, et al., "Synthesis of Eu [sup 2+]-Activated MYSi [sub 4] N [sub 7] (M=Ca, Sr, Ba) and SrYSi [sub 4-x] Al [sub x] N [sub 7-x] O [sub x] (x=0-1) Green Phosphors by Carbothermal Reduction and Nitridation", Journal of the Electrochemical Society, vol. 157, No. 3 (Jan. 2010) pp. J64-J68.
W. Liu, et al., "(Ba,Sr)Y2Si2Al2O2N5:Eu2+: a novel near-ultraviolet converting green phosphor for white light-emitting diodes", Journal of Materials Chemistry, vol. 21 (2011) pp. 3740-3744.

* cited by examiner

PHOSPHORS

The present invention relates to europium-doped phosphors, to a process for the preparation thereof, and to the use of these compounds as conversion phosphors. The present invention furthermore relates to light-emitting devices which comprise the phosphor according to the invention.

For more than 100 years, inorganic phosphors have been developed in order to adapt the spectra of emissive display screens, X-ray amplifiers and radiation or light sources in such a way that they meet the requirements of the respective area of application in as optimal a manner as possible and at the same time consume as little energy as possible. The type of excitation, i.e. the nature of the primary radiation source, and the requisite emission spectrum are of crucial importance here for the choice of host lattice and the activators.

In particular for fluorescent light sources for general lighting, i.e. low-pressure discharge lamps and light-emitting diodes, novel phosphors are constantly being developed in order further to increase the energy efficiency, colour reproduction and stability. These phosphors are employed, in particular, as conversion phosphors for phosphor-converted LEDs, pc-LEDs for short. In order to obtain white-emitting inorganic LEDs by additive colour mixing, yellow- or green- and red-emitting phosphors are required if the primary energy light source is a blue-emitting semiconductor. If, by contrast, violet- or near-UV-emitting semiconductors are used, the luminescent screen must comprise either an RGB phosphor mixture or a dichromatic mixture of a blue/cyan- and a yellow/orange-emitting phosphor. While the first variant gives greater colour reproduction, a higher lumen equivalent is obtained in the second variant, so long as broad-band emitters are used in all cases. A further advantage of a dichromatic phosphor mixture is the lower spectral interaction and the associated higher "package gain". This is also the reason why dichromatic white LEDs based on a blue-emitting semiconductor and a YAG:Ce phosphor as luminescent screen have very good properties with respect to the lumen equivalent and the associated lumen efficiency and are widespread. The greatest disadvantage of dichromatic (blue/yellow) LEDs is their high colour temperature (>4000 K) and the low colour reproduction in the red spectral region. Trichromatic LEDs based on a blue semiconductor and a green- and red-emitting phosphor have clear advantages here. For this purpose, the search for improved red- and green-emitting phosphors continues.

In the meantime, many conversion phosphor material systems are known, such as, for example, alkaline-earth metal orthosilicates, thiogallates, garnets, nitrides, oxynitrides and β-SiAlONs, each of which are doped with $Ce^{3+}$ or $Eu^{2+}$.

The object of the present invention is to provide novel, in particular green- to yellow-emitting phosphors, in particular those which have improvements in one or more properties, such as in relation to synthetic accessibility, emission colour, quantum efficiency or thermal stability.

Surprisingly, it has been found that a class of novel europium-doped phosphors achieves this object and is very highly suitable for use in a phosphor-converted LED, in particular as green to yellow phosphor, depending on the metals used. These materials are suitable not only for efficient conversion of UV radiation, but also of blue/violet light and are therefore eminently suitable for use in phosphor-converted LEDs. The present invention therefore relates to this compound and to the preparation and use thereof in a phosphor-converted LED.

T. Kurushima et al. (J. Electrochem. Soc. 2010, 157(3), J64-J68) disclose a strontium yttrium aluminium silicooxynitride which has been obtained in a solid-state synthesis using ammonium chloride as fluxing agent. The use of this compound as phosphor in a phosphor-converted LED is not disclosed.

The present invention relates to a compound of the following formula (1):

where the following applies to the symbols and indices used:

EA is selected from the group consisting of Mg, Ca, Sr, Ba or a mixture of two or more of the elements Mg, Ca, Sr and Ba;

M is selected from the group consisting of Y, Lu or a mixture of Y and Lu;

$0.004 \leq x \leq 3.0$;

$0 < y \leq 0.25$;

with the proviso that compounds of the formula $SrYSi_{4-x}Al_xN_{7-x}O_x:y\ Eu^{2+}$ where $0.004 \leq x \leq 1.0$ are excluded from the invention.

In a preferred embodiment of the invention, x is ≥2 if EA stands for Sr and M stands for Y. In a particularly preferred embodiment of the invention, EA is not equal to Sr if M stands for Y.

In a preferred embodiment of the invention, EA stands for a mixture of two or more of the elements Mg, Ca, Sr or Ba and/or M stands for a mixture of Y and Lu. Preference is thus given to a compound of the following formula (2),

where x and y have the above-mentioned meanings and furthermore:

$0 \leq a \leq 1$;
$0 \leq b \leq 1$;
$0 \leq c \leq 1$;
$0 \leq d \leq 1$;
$a+b+c+d=1$;
$0 \leq e \leq 1$;
$0 \leq f \leq 1$;
$0 \leq e+f=1$;

at least three of the indices a, b, c, d, e and f are >0.

Preferred embodiments of the compounds of the formula (2) are compounds in which Ca and Sr, Sr and Ba or Y and Lu are present simultaneously. Preference is thus given to the compounds of the following formulae (2a) to (2n),

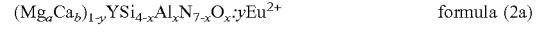 formula (2a)

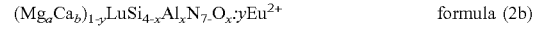 formula (2b)

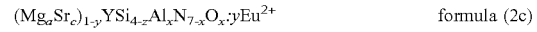 formula (2c)

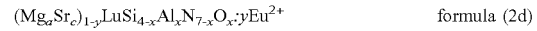 formula (2d)

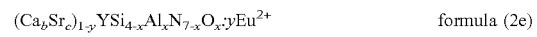 formula (2e)

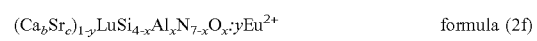 formula (2f)

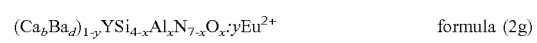 formula (2g)

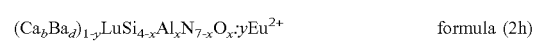 formula (2h)

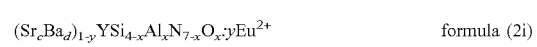 formula (2i)

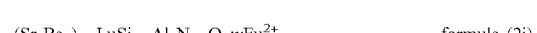 formula (2j)

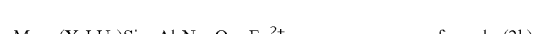 formula (2k)

$$Ca_{1-y}(Y_eLu_f)Si_{4-x}Al_xN_{7-x}O_x{:}yEu^{2+} \quad \text{formula (2l)}$$

$$Sr_{1-y}(Y_eLu_f)Si_{4-x}Al_xN_{7-x}O_x{:}yEu^{2+} \quad \text{formula (2m)}$$

$$Ba_{1-y}(Y_eLu_f)Si_{4-x}Al_xN_{7-x}O_x{:}yEu^{2+} \quad \text{formula (2n)}$$

where x and y have the above-mentioned meanings and furthermore:
0<a≤1;
0<b≤1;
0<c≤1;
0<d≤1;
0<e≤1;
0<f≤1;
a+b=1 in formulae (2a) and (2b);
a+c=1 in formulae (2c) and (2d);
b+c=1 in formulae (2e) and (2f);
b+d=1 in formulae (2g) and (2h);
c+d=1 in formulae (2i) and (2j);
e+f=1 in formulae (2k) to (2n).

The ratio of the alkaline-earth metals to one another or of the metals M to one another can be adjusted here as desired and without gaps. The emission colour of the compounds according to the invention can be adjusted depending on this ratio.

In a preferred embodiment of the invention, the Mg:Ca, Mg:Sr, Ca:Sr, Ca:Ba or Sr:Ba ratio, based on the molar amounts, i.e. the a:b, a:c, b:c, b:d or c:d ratio, in the formulae (2a) to (2j) is between 50:1 and 1:50, particularly preferably between 20:1 and 1:20, very particularly preferably between 10:1 and 1:10.

In a preferred embodiment of the invention, the Y:Lu ratio, based on the molar amounts, i.e. the e:f ratio, in the formulae (2k) to (2n) is between 50:1 and 1:50, particularly preferably between 20:1 and 1:20, very particularly preferably between 10:1 and 1:10, especially between 5:1 and 1:5.

In a further preferred embodiment, the alkaline-earth metal EA is equal to Ba or equal to Ca or equal to Mg. Preference is thus given to a compound of the following formula (3), (4) or (5), $$Mg_{1-y}MSi_{4-x}Al_xN_{7-x}O_x{:}yEu^{2+} \quad \text{formula (3)}$$

$$Ca_{1-y}MSi_{4-x}Al_xN_{7-x}O_x{:}yEu^{2+} \quad \text{formula (4)}$$

$$Ba_{1-y}MSi_{4-x}Al_xN_{7-x}O_x{:}yEu^{2+} \quad \text{formula (5)}$$

where the symbols and indices used have the above-mentioned meanings.

Preferred embodiments of the compounds of the formulae (3), (4) and (5) are the compounds of the following formulae (3a), (3b), (4a), (4b), (5a) and (5b), $$Mg_{1-y}YSi_{4-x}Al_xN_{7-x}O_x{:}yEu^{2+} \quad \text{formula (3a)}$$

$$Mg_{1-y}LuSi_{4-x}Al_xN_{7-x}O_x{:}yEu^{2+} \quad \text{formula (3b)}$$

$$Ca_{1-y}YSi_{4-x}Al_xN_{7-x}O_x{:}yEu^{2+} \quad \text{formula (4a)}$$

$$Ca_{1-y}LuSi_{4-x}Al_xN_{7-x}O_x{:}yEu^{2+} \quad \text{formula (4b)}$$

$$Ba_{1-y}YSi_{4-x}Al_xN_{7-x}O_x{:}yEu^{2+} \quad \text{formula (5a)}$$

$$Ba_{1-y}LuSi_{4-x}Al_xN_{7-x}O_x{:}yEu^{2+} \quad \text{formula (5b)}$$

where the indices used have the above-mentioned meanings.

In still a further preferred embodiment of the invention, the metal M is equal to lutetium. Preference ids thus given to a compound of the following formula (6), $$(EA)_{1-y}LuSi_{4-x}Al_xN_{7-x}O_x{:}yEu^{2+} \quad \text{formula (6)}$$

where the symbols and indices used have the above-mentioned meanings.

Preferred embodiments of the compounds of the formula (6) are the compounds of the following formulae (6a), (6b) and (6c), $$Mg_{1-y}LuSi_{4-x}Al_xN_{7-x}O_x{:}yEu^{2+} \quad \text{formula (6a)}$$

$$Sr_{1-y}LuSi_{4-x}Al_xN_{7-x}O_x{:}yEu^{2+} \quad \text{formula (6b)}$$

$$Ba_{1-y}LuSi_{4-x}Al_xN_{7-x}O_x{:}yEu^{2+} \quad \text{formula (6c)}$$

where the indices used have the above-mentioned meanings.

In a preferred embodiment of the compounds of the formulae (1) to (6) and formulae (2a) to (2n) and formulae (3a) and (3b) and formulae (4a) and (4b) and (5a) and (5b) and formulae (6a) to (6c), the following applies to the index x: 0.5≤x≤2.0. particularly preferably 1.1≤x≤1.8, especially preferably 1.3≤x≤1.7.

In a further preferred embodiment of the compounds of the formulae (1) to (6) and formulae (2a) to (2n) and formulae (3a) and (3b) and formulae (4a) and (4b) and (5a) and (5b) and formulae (6a) to (6c), the following applies to the index y: 0<y≤0.20, particularly preferably 0.02≤y≤0.16. The emission colour of the phosphor can be adjusted over a certain range here through the value of y, i.e. the proportion of Eu.

The above-mentioned preferences for x and y particularly preferably apply simultaneously. Preference is thus given to compounds of the formulae (1) to (6) and formulae (2a) to (2n) and formulae (3a) and (3b) and formulae (4a) and (4b) and (5a) and (5b) and formulae (6a) to (6c) for which:
0.5≤x≤2.0 and
0<y≤0.20.

Particular preference is given to compounds of the formulae (1) to (6) and formulae (2a) to (2n) and formulae (3a) and (3b) and formulae (4a) and (4b) and (5a) and (5b) and formulae (6a) to (6c) for which:
1.1≤x≤1.8 and
0.02≤y≤0.16.

It is furthermore preferred for the compounds according to the invention to contain not only Mg as alkaline-earth metal, i.e. for them to contain either only Ca, Sr and/or Ba as alkaline-earth metals, or for them, if they contain Mg, to contain this in a mixture with Ca and/or Sr, in particular in a mixture with Ca. If Mg is present in a mixture with Ca and/or Sr, Ca or Sr is then preferably present in this mixture in a proportion of at least 30 atom-%, particularly preferably in a proportion of at least 50 atom-%. The compounds according to the invention particularly preferably contain absolutely no Mg, i.e. the index a is preferably=0 in compounds of the formula (2) and the preferred embodiments.

The present invention furthermore relates to a process for the preparation of the compounds according to the invention, comprising the following steps:

a) preparation of a mixture of an Mg, Ca, Sr and/or Ba compound, a Y and/or Lu compound, an Si compound, an Al compound and an Eu compound, where at least one of these compounds is in the form of a nitride and at least one of these compounds is in the form of an oxide; and b) calcination of the mixture under non-oxidising conditions.

Suitable as Ca, Sr or Ba compound are, in particular, the corresponding nitrides, oxides and carbonates. Preference is given to the nitrides, i.e. calcium nitride ($Ca_3N_2$), strontium nitride ($Sr_3N_2$), barium nitride ($Ba_3N_2$) and mixtures thereof.

Suitable as Y or Lu compound are, in particular, the corresponding oxides, i.e. $Y_2O_3$ and $Lu_2O_3$ and mixtures thereof, but also the corresponding nitrides YN or LuN and mixtures thereof.

Suitable as silicon compound are, in particular, silicon nitride and silicon oxide and mixtures thereof. Preference is given to silicon nitride ($Si_3N_4$).

Suitable as aluminium compound are, in particular, aluminium nitride and aluminium oxide and mixtures thereof. Preference is given to aluminium nitride (AlN).

Suitable as europium compound are, in particular, europium oxide (especially $Eu_2O_3$) and europium nitride (EuN) and mixtures thereof.

The starting materials employed in step a) of the process according to the invention are preferably employed in a ratio to one another such that the number of atoms of the alkaline-earth metal, lutetium and/or yttrium, silicon, aluminium, europium, nitrogen and oxygen corresponds to the desired ratio in the product of the above-mentioned formulae. In particular, a stoichiometric ratio is used here, but a slight excess of the alkaline-earth metal nitride is also possible. A slight excess of the alkaline-earth metal nitride may therefore be advantageous since the alkaline-earth metal nitride tends towards sublimation. Furthermore, the starting materials are preferably selected so that the ratio of nitrogen to oxygen in the starting materials corresponds to the ratio in the product. Whether the starting material is thus employed in the form of the nitride and/or oxide is also decided with reference to the desired nitrogen/oxygen ratio in the product.

The mixture in step a) of the process according to the invention is preferably prepared by converting the starting compounds into a homogeneous mixture, i.e. they are employed in powder form and converted into a homogeneous mixture with one another, for example by means of a mortar.

The calcination step, i.e. step b), of the process according to the invention is carried out under non-oxidising conditions. Non-oxidising conditions are taken to mean any conceivable non-oxidising atmospheres, in particular substantially or completely oxygen-free atmospheres, i.e. an atmosphere whose maximum oxygen content is <100 ppm, in particular <10 ppm. A non-oxidising atmosphere can be generated, for example, through the use of protective gas, in particular nitrogen or argon. A preferred non-oxidising atmosphere is a reducing atmosphere. The reducing atmosphere is defined as comprising a gas having a reducing action. What gases have a reducing action is known to the person skilled in the art. Examples of suitable reducing gases are hydrogen, carbon monoxide, ammonia or ethylene, more preferably hydrogen, where these gases may also be mixed with other non-oxidising gases. The reducing atmosphere is particularly preferably produced by a mixture of nitrogen and hydrogen, preferably in the $H_2:N_2$ ratio of 10:50 to 33:30, in each case based on the volume.

The calcination step, i.e. step b), of the process according to the invention is preferably carried out at a temperature in the range from 1200° C. to 2000° C., particularly preferably in the range from 1400° C. to 1900° C. and very particularly preferably in the range from 1500° C. to 1700° C. The use of a fluxing agent may be omitted here. The temperatures indicated above apply, in particular, to the preparation of compounds which contain only one alkaline-earth metal. In the case of the use of a mixture of a plurality of alkaline-earth metals, lower calcination temperatures may also be preferred.

The calcination time here is preferably 1 to 48 h, particularly preferably 5 to 24 h and very particularly preferably 8 to 12 h.

Even though it is not necessarily required in the process according to the invention, since the compounds can also be prepared very well without the addition of a fluxing agent at temperatures of about 1600° C., it is nevertheless also possible to use a fluxing agent. In the case of the additional use of a fluxing agent, lower calcination temperatures may also be preferred.

The calcination is preferably in each case carried out by introducing the resultant mixtures, for example, into a boron nitride vessel in a high-temperature oven. The high-temperature oven is, for example, a tubular oven which contains a molybdenum foil tray.

It may also be advantageous for the phosphor obtained in this way to be aftertreated by mixing it, for example, with an alkaline-earth metal nitride and calcining this mixture again.

The phosphors can be worked up by washing, for example by washing with dilute acid, such as, for example, dilute HCl. However, a work-up of this type is not necessarily required.

In a further embodiment of the invention, the calcination and work-up are followed by a further calcination step, which is usually carried out at comparable temperatures as the first calcination step. This further calcination step is preferably carried out under a reducing atmosphere. This may result in better crystallinity of the product.

In still a further embodiment, the compounds according to the invention can be coated. The coating can, in particular, improve the stability to air and water. Suitable for this purpose are all coating methods as are known to the person skilled in the art in accordance with the prior art and are used for phosphors. Suitable materials for the coating are, in particular, metal oxides and nitrides, in particular alkaline-earth metal oxides, such as $Al_2O_3$, and alkaline-earth metal nitrides, such as AlN, as well as $SiO_2$, $B_2O_3$ or BN. The coating can be carried out, for example, from solution or by fluidised-bed methods. Further suitable coating methods are known from JP 04-304290, WO 91/10715, WO 99/27033, US 2007/0298250, WO 2009/065480 and WO 2010/075908.

The present invention furthermore relates to the use of the compound of the formula (1) according to the invention or the preferred compounds indicated above as phosphor, in particular as conversion phosphor.

The term "conversion phosphor" in the present application is taken to mean a material which absorbs radiation in a certain wavelength region of the electromagnetic spectrum, preferably in the blue, violet or UV spectral region, and emits visible light in another wavelength region of the electromagnetic spectrum, preferably in the red, orange, yellow or green spectral region. The term "radiation-induced emission efficiency" should also be understood in this connection, i.e. the conversion phosphor absorbs radiation in a certain wavelength region and emits radiation with a certain efficiency in another wavelength region.

The present invention furthermore relates to an emission-converting material comprising the compound of the formula (1) according to the invention or the preferred embodiments. The emission-converting material may consist of the compound according to the invention and would in this case be equivalent to the term "conversion phosphor" defined above.

It is also possible for the emission-converting material according to the invention to comprise further conversion phosphors besides the compound according to the invention.

In this case, the emission-converting material according to the invention comprises a mixture of at least two conversion phosphors, where one of these is a compound of the formula (1) according to the invention or the preferred embodiments. It is particularly preferred for the at least two conversion phosphors to be phosphors which emit light of different wavelengths. Since the compound of the formula (1) according to the invention or the preferred embodiments is a green- or yellow-emitting phosphor, this is preferably employed in combination with an orange- or red-emitting phosphor and optionally additionally with a cyan- or blue-emitting phosphor. It may thus be preferred for the conversion phosphor according to the invention to be employed in the emission-converting material according to the invention in combination with one or more further conversion phosphors, which then together preferably emit white light.

In the context of this application, blue light denotes light whose emission maximum lies between 400 and 459 nm, cyan light denotes light whose emission maximum lies between 460 and 505 nm, green light denotes light whose emission maximum lies between 506 and 545 nm, yellow light denotes light whose emission maximum lies between 546 and 565 nm, orange light denotes light whose emission maximum lies between 566 and 600 nm and red light denotes light whose emission maximum lies between 601 and 670 nm.

In general, any possible conversion phosphor can be employed as a further conversion phosphor which can be employed together with the compound according to the invention. The following, for example, are suitable here: $Ba_2SiO_4:Eu^{2+}$, $BaSi_2O_6:Pb^{2+}$, $Ba_xSr_{1-x}F_2:Eu^{2+}$, $BaSrMgSi_2O_7:Eu^{2+}$, $BaTiP_2O_7$, $(Ba,Ti)_2P_2O_7:Ti$, $Ba_3WO_6$: U, $BaY_2F_8:Er^{3+},Yb^+$, $Be_2SiO_4:Mn^{2+}$, $Bi_4Ge_3O_{12}$, $CaAl_2O_4$: $Ce^{3+}$, $CaLa_4O_7:Ce^{3+}$, $CaAl_2O_4:Eu^{2+}$, $CaAl_2O_4:Mn^{2+}$, $CaAl_4O_7:Pb^{2+}$, $Mn^{2+}$, $CaAl_2O_4:Tb^{3+}$, $Ca_3Al_2Si_3O_{12}:Ce^{3+}$, $Ca_3Al_2Si_3Oi_2:Ce^{3+}$, $Ca_3Al_2Si_3O_2:Eu^{2+}$, $Ca_2B_6O_9Br:Eu^{2+}$, $Ca_2B_6O_9Cl:Eu^{2+}$, $Ca_2B_6O_9Cl:Pb^{2+}$, $CaB_2O_4:Mn^{2+}$, $Ca_2B_2O_6:Mn^{2+}$, $CaB_2O_4:Pb^{2+}$, $CaB_2P_2O_9:Eu^{2+}$, $Ca_6B_2SiO_{10}:Eu^{3+}$, $Ca_{0.6}Ba_{0.6}Al_{12}O_{19}:Ce^{3+}$, $Mn^{2+}$, $Ca_2Ba_3(PO_4)_3Cl:Eu^{2+}$, $CaBr_2:Eu^{2+}$ in $SiO_2$, $CaCl_2:Eu^{2+}$ in $SiO_2$, $CaCl_2:Eu^{2+}$, $Mn^{2+}$ in $SiO_2$, $CaF_2:Ce^{3+}$, $CaF_2:Ce^{3+}$, $Mn^{2+}$, $CaF_2:Ce^{3+}$, $Tb^{3+}$, $CaF_2:Eu^{2+}$, $CaF_2:Mn^{2+}$, $CaF_2$:U, $CaGa_2O_4:Mn^{2+}$, $CaGa_4O_7:Mn^{2+}$, $CaGa_2S_4:Ce^{3+}$, $CaGa_2S_4.Eu^{2+}$, $CaGa_2S_4:Mn^{2+}$, $CaGa_2S_4:Pb^{2+}$, $CaGeO_3$: $Mn^{2+}$, $CaI_2:Eu^{2+}$ in $SiO_2$, $CaI_2:Eu^{2+}$, $Mn^{2+}$ in $SiO_2$, $CaLaBO_4:Eu^{3+}$, $CaLaB_3O_7:Ce^{3+}$, $Mn^{2+}$, $Ca_2La_2BO_{6.5}:Pb^{2+}$, $Ca_2MgSi_2O_7$, $Ca_2MgSi_2O_7:Ce^{3+}$, $CaMgSi_2O_6:Eu^{2+}$, $Ca_3MgSi_2O_8:Eu^{2+}$, $Ca_2MgSi_2O_7:Eu^{2+}$, $CaMgSi_2O_6:Eu^{2+}$, $Mn^{2+}$, $Ca_2MgSi_2O_7:Eu^{2+}$, $Mn^{2+}$, $CaMoO_4$, $CaMoO_4:Eu^{3+}$, $CaO:Bi^{3+}$, $CaO:Cd^{2+}$, $CaO:Cu^+$, $CaO:Eu^{3+}$, $CaO:Eu^{3+}$, $Na^+$, $CaO:Mn^{2+}$, $CaO:Pb^{2+}$, $CaO:Sb^{3+}$, $CaO:Sm^{3+}$, $CaO:Tb^{3+}$, $CaO:Tl$, $CaO:Zn^{2+}$, $Ca_2P_2O_7:Ce^{3+}$, $\alpha\text{-}Ca_3(PO_4)_2:Ce^{3+}$, $\beta\text{-}ca_3(PO_4)_2:Ce^{3+}$, $Ca_5(PO_4)_3Cl:Eu^{2+}$, $Ca_5(PO_4)_3Cl:Mn^{2+}$, $Ca_5(PO_4)_3Cl:Sb^{3+}$, $Ca_5(PO_4)_3Cl:Sn^{2+}$, $\beta\text{-}Ca_3(PO_4)_2:Eu^{2+}$, $Mn^{2+}$, $Ca_5(PO_4)_3F:Mn^{2+}$, $Ca_5(PO_4)_3F:Sb^{3+}$, $Ca_5(PO_4)_3F$: $Sn^{2+}$, $\alpha\text{-}Ca_3(PO_4)_2:Eu^{2+}$, $\beta\text{-}Ca_3(PO_4)_2:Eu^{2+}$, $Ca_2P_2O_7:Eu^{2+}$, $Ca_2P_2O_7:Eu^{2+}$, $Mn^{2+}$, $CaP_2O_6:Mn^{2+}$, $\alpha\text{-}Ca_3(PO_4)_2:Pb^{2+}$, $\alpha\text{-}Ca_3(PO_4)_2:Sn^{2+}$, $\beta\text{-}Ca_3(PO_4)_2:Sn^{2+}$, $\beta\text{-}Ca_2P_2O_7:Sn$, $Mn$, $\alpha\text{-}Ca_3(PO_4)_2:Tr$, $CaS:Bi^{3+}$, $CaS:Bi^{3+}$, $Na$, $CaS:Ce^{3+}$, $CaS$: $Eu^{2+}$, $CaS:Cu^+$, $Na^+$, $CaS:La^{3+}$, $CaS:Mn^{2+}$, $CaSO_4:Bi$, $CaSO_4:Ce^{3+}$, $CaSO_4:Ce^{3+}$, $Mn^{2+}$, $CaSO_4:Eu^{2+}$, $CaSO_4$: $Eu^{2+}$, $Mn^{2+}$, $CaSO_4:Pb^{2+}$, $CaS:Pb^{2+}$, $CaS:Pb^{2+}$, $Cl$, $CaS$: $Pb^{2+}$, $Mn^{2+}$, $CaS:Pr^{3+}$, $Pb^{2+}$, $Cl$, $CaS:Sb^{3+}$, $CaS:Sb^{3+}$, $Na$, $CaS:Sm^{3+}$, $CaS:Sn^{2+}$, $CaS:Sn^{2+}$, $F$, $CaS:Tb^{3+}$, $CaS:Tb^{3+}$, $Cl$, $CaS:Y^{3+}$, $CaS:Yb^{2+}$, $CaS:Yb^{2+}$, $Cl$, $CaSiO_3:Ce^{3+}$, $Ca_3SiO_4Cl_2:Eu^{2+}$, $Ca_3SiO_4Cl_2:Pb^{2+}$, $CaSiO_3:Eu^{2+}$, $CaSiO_3$: $Mn^{2+}$, $Pb$, $CaSiO_3:Pb^{2+}$, $CaSiO_3:Pb^{2+}$, $Mn^{2+}$, $CaSiO_3:Ti^{4+}$, $CaSr_2(PO_4)_2:Bi^{3+}$, $\beta\text{-}(Ca,Sr)_3(PO_4)_2:Sn^{2+}Mn^{2+}$, $CaTi_{0.9}Al_{0.1}O_3:Bi^{3+}$, $CaTiO_3:Eu^{3+}$, $CaTiO_3:Pr^{3+}$, $Ca_6(VO_4)_3$ Cl, $CaWO_4$, $CaWO_4:Pb^{2+}$, $CaWO_4:W$, $Ca_3WO_6$:U, $CaYAlO_4:Eu^{3+}$, $CaYBO_4:Bi^{3+}$, $CaYBO_4:Eu^{3+}$, $CaYB_{0.8}O_{3.7}:Eu^{3+}$, $CaY_2ZrO_6:Eu^{3+}$, $(Ca,Zn,Mg)_3(PO_4)_2$: Sn, $CeF_3$, $(Ce,Mg)BaAl_{11}O_{18}:Ce$, $(Ce,Mg)SrAl_{11}O_{18}:Ce$, $CeMgAl_{11}O_{19}:Ce:Tb$, $Cd_2B_6O_{11}:Mn^{2+}$, $CdS:Ag^+$, $Cr$, $CdS$: In, $CdS:In$, $CdS:In,Te$, $CdS:Te$, $CdWO_4$, $CsF$, $CsI$, $CsI:Na^+$, $CsI:Tl$, $(ErCl_3)_{0.26}(BaCl_2)_{0.75}$, $GaN:Zn$, $Gd_3Ga_6O_{12}:Cr^{3+}$, $Gd_3Ga_5O_{12}:Cr$, Ce, $GdNbO_4:Bi^{3+}$, $Gd_2O_2S:Eu^{3+}$, $Gd_2O_2Pr^{3+}$, $Gd_2O_2S:Pr$, Ce, F, $Gd_2O_2S:Tb^{3+}$, $Gd_2SiO_6$: $Ce^{3+}$, $KAl_{11}O_{17}:Tl^+$, $KGa_{11}O_{17}:Mn^{2+}$, $K_2La_2Ti_3O_{10}:Eu$, $KMgF_3:Eu^{2+}$, $KMgF_3:Mn^{2+}$, $K_2SiF_6:Mn^{4+}$, $LaAl_3B_4O_{12}$: $Eu^{3+}$, $LaAlB_2O_6:Eu^{3+}$, $LaAlO_3:Eu^{3+}$, $LaAlO_3:Sm^{3+}$, $LaAsO_4:Eu^{3+}$, $LaBr_3:Ce^{3+}$, $LaBO_3:Eu^{3+}$, $(La,Ce,Tb)PO_4$: Ce:Tb, $LaCl_3:Ce^{3+}$, $La_2O_3:Bi^{3+}$, $LaOBr:Tb^{3+}$, $LaOBr:Tm^{3+}$, $LaOCl:Bi^{3+}$, $LaOCl:Eu^{3+}$, $LaOF:Eu^{3+}$, $La_2O_3:Eu^{3+}$, $La_2O_3$: $Pr^{3+}$, $La_2O_2S:Tb^{3+}$, $LaPO_4:Ce^{3+}$, $LaPO_4:Eu^{3+}$, $LaSiO_3Cl$: $Ce^{3+}$, $LaSiO_3Cl:Ce^{3+},Tb^{3+}$, $LaVO_4:Eu^{3+}$, $La_2W_3O_{12}:Eu^{3+}$, $LiAlF_4:Mn^{2+}$, $LiAl_6O_8:Fe^{3+}$, $LiAlO_2:Fe^{3+}$, $LiAlO_2:Mn^{2+}$, $LiAl_6O_8:Mn^{2+}$, $Li_2CaP_2O_7:Ce^{3+}$, $Mn^{2+}$, $LiCeBa_4Si_4O_{14}$: $Mn^{2+}$, $LiCeSrBa_3Si_4O_{14}:Mn^{2+}$, $LiInO_2:Eu^{3+}$, $LiInO_2:Sm^{3+}$, $LiLaO_2:Eu^{3+}$, $LuAlO_3:Ce^{3+}$, $(Lu,Gd)_2SiO_5:Ce^{3+}$, $Lu_2SiO_5$: $Ce^{3+}$, $Lu_2Si_2O_7:Ce^{3+}$, $LuTaO_4:Nb^{5+}$, $Lu_{1-x}Y_xAlO_3:Ce^{3+}$, $MgAl_2O_4:Mn^{2+}$, $MgSrAl_{10}O_{17}:Ce$, $MgB_2O_4:Mn^{2+}$, $MgBa_2(PO_4)_2:Sn^{2+}$, $MgBa_2(PO_4)_2$:U, $MgBaP_2O_7:Eu^{2+}$, $MgBaP_2O_7:Eu^{2+}$, $Mn^{2+}$, $MgBa_3Si_2O_8:Eu^{2+}$, $MgBa(SO_4)_2$: $Eu^{2+}$, $Mg_3Ca_3(PO_4)_4:Eu^{2+}$, $MgCaP_2O_7:Mn^{2+}$, $Mg_2Ca(SO_4)_3:Eu^{2+}$, $Mg_2Ca(SO_4)_3:Eu^{2+}$, $Mn^2$, $MgCeAl_nO_{19}:Tb^{3+}$, $Mg_4(F)GeO_6:Mn^{2+}$, $Mg_4(F)(Ge,Sn)O_6:Mn^{2+}$, $MgF_2:Mn^{2+}$, $MgGa_2O_4:Mn^{2+}$, $Mg_8Ge_2O_{11}F_2:Mn^{4+}$, $MgS:Eu^{2+}$, $MgSiO_3$: $Mn^{2+}$, $Mg_2SiO_4:Mn^{2+}$, $Mg_3SiO_3F_4:Ti^{4+}$, $MgSO_4:Eu^{2+}$, $MgSO_4:Pb^{2+}$, $MgSrBa_2Si_2O_7:Eu^{2+}$, $MgSrP_2O_7:Eu^{2+}$, $MgSr_5(PO_4)_4:Sn^{2+}$, $MgSr_3Si_2O_8:Eu^{2+}$, $Mn^{2+}$, $Mg_2Sr(SO_4)_3:Eu^{2+}$, $Mg_2TiO_4:Mn^{4+}$, $MgWO_4$, $MgYBO_4:Eu^{3+}$, $Na_3Ce(PO_4)_2:Tb^{3+}$, NaI:Tl, $Na_{1.23}K_{O.42}Eu_{0.12}TiSi_4O_{11}$: $Eu^{3+}$, $Na_{1.23}K_{0.42}Eu_{0.12}TiSi_5O_{13}.xH_2O:Eu^{3+}$, $Na_{1.29}K_{0.46}Er_{0.08}TiSi_4O_{11}:Eu^{3+}$, $Na_2Mg_3Al_2Si_2O_{10}:Tb$, $Na(Mg_{2-x}Mn_x)LiSi_4O_{10}F_2:Mn$, $NaYF_4:Er^{3+}$, $Yb^{3+}$, $NaYO_2$: $Eu^{3+}$, P46(70%)+P47 (30%), $SrAl_{12}O_{19}:Ce^{3+}$, $Mn^{2+}$, $SrAl_2O_4:Eu^{2+}$, $SrAl_4O_7:Eu^{3+}$, $SrAl_{12}O_{19}:Eu^{2+}$, $SrAl_2S_4$: $Eu^{2+}$, $Sr_2B_5O_9Cl:Eu^{2+}$, $SrB_4O_7:Eu^{2+}$ (F,Cl,Br), $SrB_4O_7$: $Pb^{2+}$, $SrB_4O_7:Pb^{2+}$, $Mn^{2+}$, $SrB_8O_{13}:Sm^{2+}$, $Sr_xBa_yCl_z Al_2O_{4-z/2}$: $Mn^{2+}$, $Ce^{3+}$, $SrBaSiO_4:Eu^{2+}$, $Sr(Cl,Br,I)_2:Eu^{2+}$ in $SiO_2$, $SrCl_2:Eu^{2+}$ in $SiO_2$, $Sr_5Cl(PO_4)_3:Eu$, $Sr_wF_xB_4O_{6.5}$: $Eu^{2+}$, $Sr_wF_xB_yO_z:Eu^{2+}$, $Sm^{2+}$, $SrF_2:Eu^{2+}$, $SrGa_{12}O_{19}:Mn^{2+}$, $SrGa_2S_4:Ce^{3+}$, $SrGa_2S_4:Eu^{2+}$, $SrGa_2S_4:Pb^{2+}$, $SrIn_2O_4:Pr^{3+}$, $Al^{3+}$, $(Sr,Mg)_3(PO_4)_2:Sn$, $SrMgSi_2O_6:Eu^{2+}$, $Sr_2MgSi_2O_7$: $Eu^{2+}$, $Sr_3MgSi_2O_8:Eu^{2+}$, $SrMoO_4$:U, $SrO.3B_2O_3:Eu^{2+},Cl$, $\beta\text{-}SrO.3B_2O_3:Pb^{2+}$, $\beta\text{-}SrO.3B_2O_3:Pb^{2+}$, $Mn^{2+}$, $\alpha\text{-}SrO.3B_2O_3:Sm^{2+}$, $Sr_6P_5BO_{20}:Eu$, $Sr_5(PO_4)_3Cl:Eu^{2+}$, $Sr_5(PO_4)_3Cl:Eu^{2+}$, $Pr^{3+}$, $Sr_5(PO_4)_3Cl:Mn^{2+}$, $Sr_5(PO_4)_3Cl:Sb^{3+}$, $Sr_2P_2O_7:Eu^{2+}$, $p\text{-}Sr_3(PO_4)_2:Eu^{2+}$, $Sr_5(PO_4)_3F:Mn^{2+}$, $Sr_5(PO_4)_3F:Sb^{3+}$, $Sr_5(PO_4)_3F:Sb^{3+}$, $Mn^{2+}$, $Sr_5(PO_4)_3F:Sn^{2+}$, $Sr_2P_2O_7:Sn^{2+}$, $\beta\text{-}Sr_3(PO_4)_2:Sn^{2+}$, $\beta\text{-}Sr_3(PO_4)_2:Sn^{2+}$, $Mn^{2+}$ (Al), $SrS:Ce^{3+}$, $SrS:Eu^{2+}$, $SrS:Mn^{2+}$, $SrS:Cu^+$, Na, $SrSO_4$: Bi, $SrSO_4:Ce^{3+}$, $SrSO_4:Eu^{2+}$, $SrSO_4:Eu^{2+}$, $Mn^{2+}$, $Sr_5Si_4O_{10}Cl_6:Eu^{2+}$, $Sr_2SiO_4:Eu^{2+}$, $SrTiO_3:Pr^{3+}$, $SrTiO_3$: $Pr^{3+}$, $Al^{3+}$, $Sr_3WO_6$:U, $SrY_2O_3:Eu^{3+}$, $ThO_2:Eu^{3+}$, $ThO_2$: $Pr^{3+}$, $ThO_2:Tb^{3+}$, $YAl_3B_4O_{12}:Bi^{3+}$, $YAl_3B_4O_{12}:Ce^{3+}$, $YAl_3B_4O_{12}:Ce^{3+}$, Mn, $YAl_3B_4O_{12}:Ce^{3+},Tb^{3+}$, $YAl_3B_4O_{12}$: $Eu^{3+}$, $YAl_3B_4O_{12}:Eu^{3+}$, $Cr^{3+}$, $YAl_3B_4O_{12}:Th^{4+},Ce^{3+}$, $Mn^{2+}$, $YAlO_3:Ce^{3+}$, $Y_3Al_5O_{12}:Ce^{3+}$, $Y_3Al_5O_{12}:Cr^{3+}$, $YAlO_3:Eu^{3+}$, $Y_3Al_5O_{12}:Eu^{3r}$, $Y_4Al_2O_9:Eu^{3+}$, $Y_3Al_5O_{12}:Mn^{4+}$, $YAlO_3$: $Sm^{3+}$, $YAlO_3:Tb^{3+}$, $Y_3Al_5O_{12}:Tb^{3+}$, $YAsO_4:Eu^{3+}$, $YBO_3$: $Ce^{3+}$, $YBO_3:Eu^{3+}$, $YF_3:Er^{3+},Yb^{3+}$, $YF_3:Mn^{2+}$, $YF_3:Mn^{2+}$, $Th^{4+}$, $YF_3:Tm^{3+}$, $Yb^{3+}$, $(Y,Gd)BO_3:Eu$, $(Y,Gd)BO_3:Tb$, $(Y,Gd)_2O_3:Eu^{3+}$, $Y_{1.34}Gd_{0.60}O_3(Eu,Pr)$, $Y_2O_3:Bi^{3+}$, $YOBrEu^{3+}$, $Y_2O_3:Ce$, $Y_2O_3:Er^{3+}$, $Y_2O_3:Eu^{3+}(YOE)$, $Y_2O_3:Ce^{3+},Tb^{3+}$, $YOCl:Ce^{3+}$, $YOCl:Eu^{3+}$, $YOF:Eu^{3+}$, $YOF:Tb^{3+}$, $Y_2O_3:Ho^{3+}$, $Y_2O_2S:Eu^{3+}$, $Y_2O_2S:Pr^{3+}$, $Y_2O_2S:Tb^{3+}$, $Y_2O_3:Tb^{3+}$, $YPO_4:Ce^{3+}$, $YPO_4:Ce^{3+},Tb^{3+}$, $YPO_4:Eu^{3+}$, $YPO_4:Mn^{2+},Th^{4+}$, $YPO_4:V^{5+}$, $Y(P,V)O_4:Eu$, $Y_2SiO_5:Ce^{3+}$, $YTaO_4$, $YTaO_4:Nb^{5+}$, $YVO_4:Dy^{3+}$, $YVO_4:Eu^{3+}$, $ZnAl_2O_4:Mn^{2+}$, $ZnB_2O_4:Mn^{2+}$, $ZnBa_2S_3:Mn^{2+}$, $(Zn,Be)_2SiO_4:Mn^{2+}$, $Zn_{0.4}Cd_{0.6}S:Ag$, $Zn_{0.6}Cd_{0.4}S:Ag$, $(Zn,Cd)S:Ag,Cl$, $(Zn,Cd)S:Cu$, $ZnF_2:Mn^{2+}$, $ZnGa_2O_4$, $ZnGa_2O_4:Mn^{2+}$, $ZnGa_2S_4:Mn^{2+}$, $Zn_2GeO_4:Mn^{2+}$, $(Zn,Mg)F_2:Mn^{2+}$, $ZnMg_2(PO_4)_2:Mn^{2+}$, $(Zn,Mg)_3(PO_4)_2:Mn^{2+}$, $ZnO:Al^{3+}$, $Ga^{3+}$, $ZnO:Bi^{3+}$, $ZnO:Ga^{3+}$, $ZnO:Ga$, $ZnO-CdO:Ga$, $ZnO:S$, $ZnO:Se$, $ZnO:Zn$, $ZnS:Ag^+$, $Cl^-$, $ZnS:Ag$, $Cu$, $Cl$, $ZnS:Ag$, $Ni$, $ZnS:Au,In$, $ZnS-CdS$ (25-75), $ZnS-CdS$ (50-50), $ZnS-CdS$ (75-25), $ZnS-CdS:Ag,Br,Ni$, $ZnS-CdS:Ag^+,Cl$, $ZnS-CdS:Cu$, $Br$, $ZnS-CdS:Cu,I$, $ZnS:Cl^-$, $ZnS:Eu^{2+}$, $ZnS:Cu$, $ZnS:Cu^+$, $Al^{3+}$, $ZnS:Cu^+,Cl^-$, $ZnS:Cu,Sn$, $ZnS:Eu^{2+}$, $ZnS:Mn^{2+}$, $ZnS:Mn$, $Cu$, $ZnS:Mn^{2+},Te^{2+}$, $ZnS:P$, $ZnS:Pb^{2+}$, $ZnS:Pb^{2+},Cl^-$, $ZnS:Pb$, $Cu$, $Zn_3(PO_4)_2:Mn^{2+}$, $Zn_2SiO_4:Mn^{2+}$, $Zn_2SiO_4:Mn^{2+}$, $As^{5+}$, $Zn_2SiO_4:Mn$, $Sb_2O_2$, $Zn_2SiO_4:Mn^{2+}$, $P$, $Zn_2SiO_4:Ti^{4+}$, $ZnS:Sn^{2+}$, $ZnS:Sn$, $Ag$, $ZnS:Sn^{2+}$, $Li^+$, $ZnS:Te$, $Mn$, $ZnS-ZnTe:Mn^{2+}$, $ZnSe:Cu^+,Cl$ or $ZnWO_4$.

Particularly suitable phosphors which can be combined with the compound according to the invention are the Phosphors shown in the following table.

| Composition | Emission colour | $\lambda_{max}$ [nm] |
| --- | --- | --- |
| $(Ba_{1-x}Sr_x)_2SiO_4:Eu$ | Green | 520-560 |
| $SrGa_2S_4:Eu$ | Green | 535 |
| $SrSi_2N_2O_2:Eu$ | Green | 541 |
| $CaSi_2N_2O_2:Eu$ | Yellow | 565 |
| $(Sr_{1-x}Ca_x)_2SiO_4:Eu$ | Orange | 560-600 |
| $MgS:Eu$ | Orange | 580 |
| $SrLi_2SiO_4:Eu$ | Orange | 585 |
| $(Ca_{1-x-y}Sr_xBa_y)_2Si_5N_8:Eu$ | Red | 580-640 |
| $(Ca_{1-x}Sr_x)AlSiN_3:Eu$ | Red | 630-650 |
| $(Ca_{1-x}Sr_x)S:Eu$ | Red | 610-655 |
| $(Sr_{1-x}Ba_x)N_2:Eu$ | Red | 620-700 |

The present invention furthermore relates to the use of the emission-converting material according to the invention in a light source. The light source is particularly preferably an LED, in particular a phosphor-converted LED, pc-LED for short. It is particularly preferred here for the emission-converting material to comprise at least one further conversion phosphor besides the conversion phosphor according to the invention, in particular so that the light source emits white light or light having a certain colour point (colour-on-demand principle). The "colour-on-demand principle" is taken to mean the achievement of light having a certain colour point with a pc-LED using one or more conversion phosphors.

The present invention thus furthermore relates to a light source which comprises a primary light source and the emission-converting material.

Here too, it is particularly preferred for the emission-converting material to comprise at least one further conversion phosphor besides the conversion phosphor according to the invention, so that the light source preferably emits white light or light having a certain colour point.

The light source according to the invention is preferably a pc-LED. A pc-LED generally comprises a primary light source and an emission-converting material. The emission-converting material according to the invention can for this purpose either be dispersed in a resin (for example epoxy or silicone resin) or, given suitable size ratios, arranged directly on the primary light source or alternatively, depending on the application, remote therefrom (the latter arrangement also includes "remote phosphor technology").

The primary light source can be a semiconductor chip, a luminescent light source, such as ZnO, a so-called TCO (transparent conducting oxide), a ZnSe— or SiC-based arrangement, an arrangement based on an organic light-emitting layer (OLED) or a plasma or discharge source, most preferably a semiconductor chip. Possible forms of primary light sources of this type are known to the person skilled in the art.

If the primary light source is a semiconductor chip, it is preferably a luminescent indium aluminium gallium nitride (InAlGaN), as is known from the prior art.

If the primary light source emits blue light, the emission-converting material preferably emits green and orange or red light. If the primary light source emits violet light or radiation in the near-UV region, the emission-converting material preferably emits cyan and yellow or orange light or particularly preferably blue, green and orange or red light.

For use in light sources, in particular pc-LEDs, the emission-converting material according to the invention can also be converted into any desired shapes, such as spherical particles, flakes and structured materials and ceramics. These shapes are summarised under the term "shaped bodies". The shaped bodies are consequently emission-converting shaped bodies. These are a further subject-matter of the present invention.

The invention still furthermore relates to a ceramic comprising at least one compound according to the invention or at least one emission-converting material according to the invention. The ceramic here may consist only of the compound according to the invention. However, it may also comprise matrix materials and/or further phosphors. Suitable matrix materials are, for example, $SiO_2$, $Y_2O_3$ or $Al_2O_3$.

The invention furthermore relates to a lighting unit which comprises at least one light source according to the invention. Lighting units of this type are employed principally in display devices, in particular liquid-crystal display devices (LC displays) with backlighting. The present invention therefore also relates to a display device of this type.

In the lighting unit according to the invention, the optical coupling between the emission-converting material and the primary light source (in particular semiconductor chips) can also take place by means of a light-conducting arrangement. In this way, it is possible for the primary light source to be installed at a central location and for this to be optically coupled to the emission-converting material by means of light-conducting devices, such as, for example, optical fibres. In this way, it is possible to achieve lamps adapted to the lighting wishes which consist of one or more different conversion phosphors, which may be arranged to form a light screen, and an optical waveguide, which is coupled to the primary light source. In this way, it is possible to place a strong primary light source at a location which is favourable for electrical installation and to install lamps comprising emission-converting materials, which are coupled to the optical waveguides, without further electrical cabling, merely by laying optical waveguides at any desired locations.

The compounds according to the invention have the following advantageous properties:
(1) The compounds emit green or yellow light having a broad emission spectrum and with high quantum efficiency. They are consequently particularly suitable for lighting applications.

(2) The compounds are very readily accessible synthetically. In particular if the compounds according to the invention contain a mixture of two or more alkaline-earth metals, they can be prepared energy-efficiently at a lower calcination temperature. In addition, the use of a fluxing agent can be entirely omitted in the synthesis of these compounds. This represents a considerable technical advantage, since the high corrosiveness of the fluxing agent, in particular fluorine-containing compounds, makes high technical demands of the process.

(3) The colour point of the emission can be shifted and thus also set specifically over a certain range through the ratio of the alkaline-earth metals to one another or the ratio of the rare-earth metals to one another or the proportion of europium.

The following examples and figures are intended to illustrate the present invention. However, they should in no way be regarded as limiting.

EXAMPLES

Figure 1:
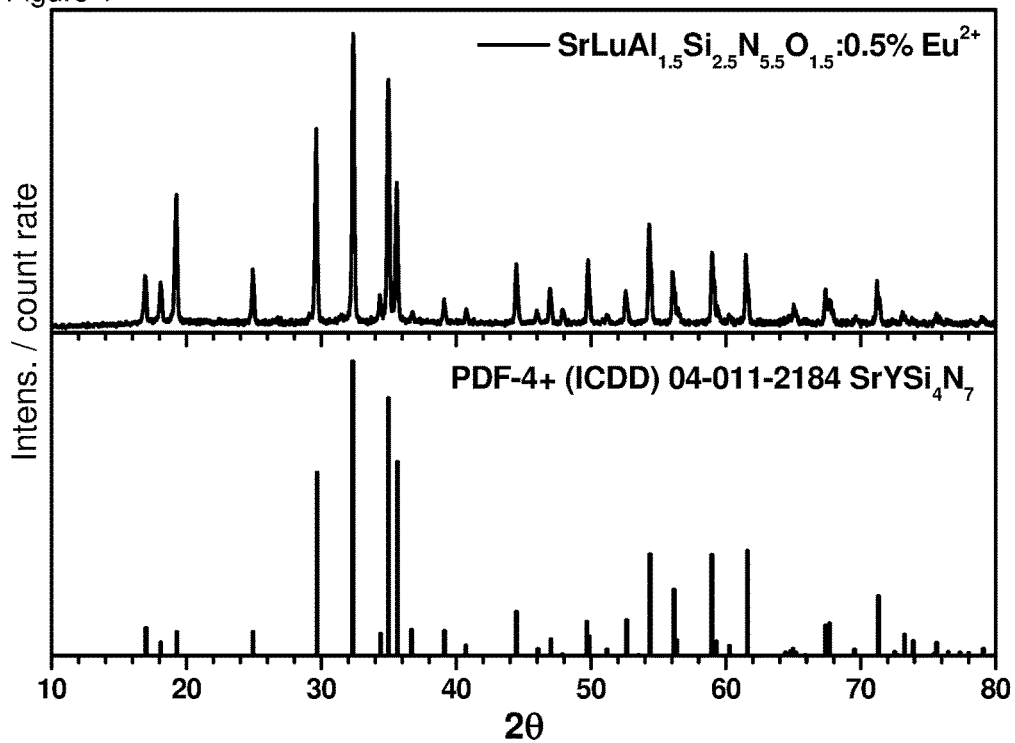
FIG. 1: X-ray powder diffraction pattern of $SrLuAl_{1.5}Si_{2.5}N_{5.5}O_{1.5}$:0.5% $Eu^{2+}$ from Example 1.
Figure 2:
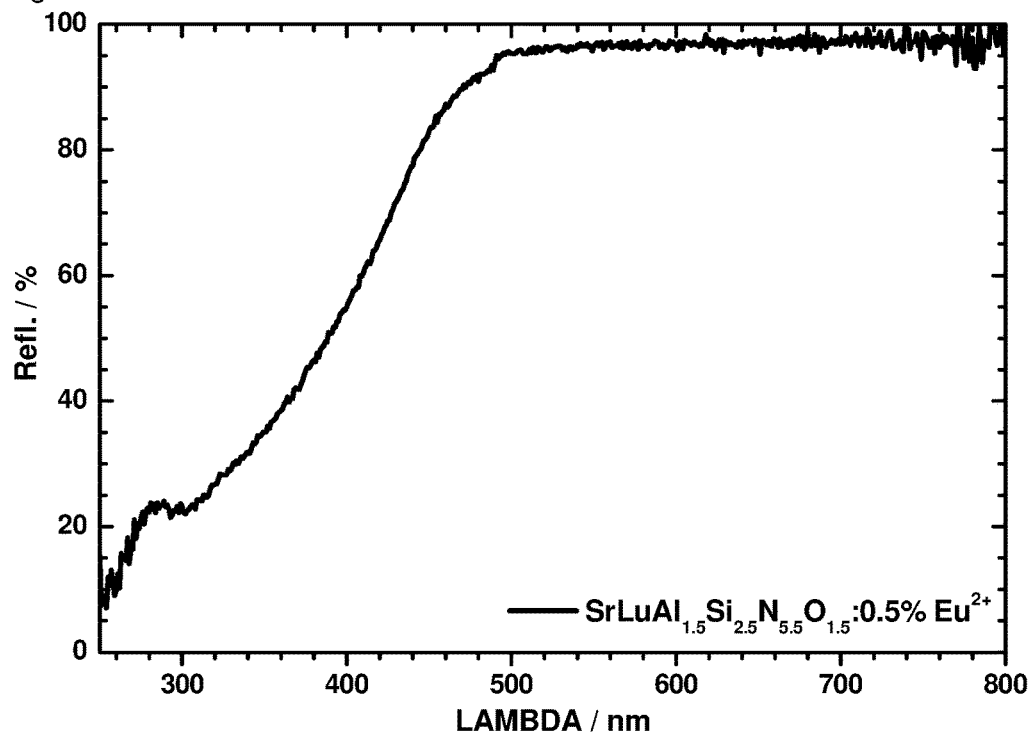
FIG. 2: Reflection spectrum of $SrLuAl_{1.5}Si_{2.5}N_{5.5}O_{1.5}$: 0.5% $Eu^{2+}$ from Example 1 (against $BaSO_4$ as white standard).
Figure 3:
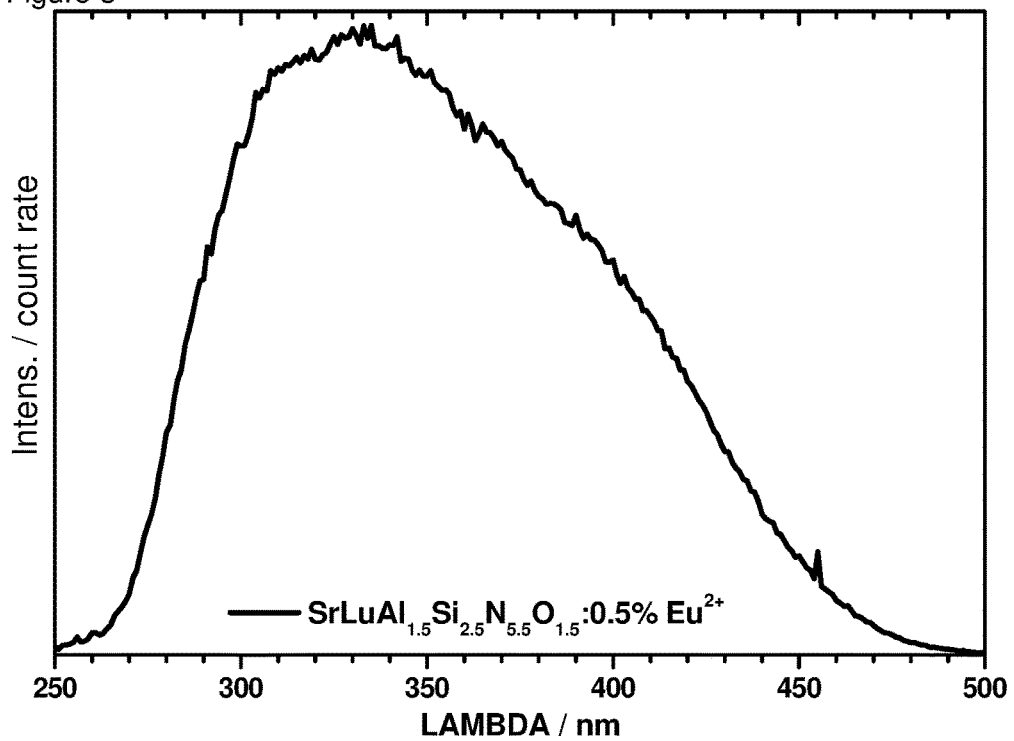
FIG. 3: Excitation spectrum of $SrLuAl_{1.5}Si_{2.5}N_{5.5}O_{1.5}$: 0.5% $Eu^{2+}$ from Example 1 ($\lambda_{em}$=530 nm).
Figure 4:
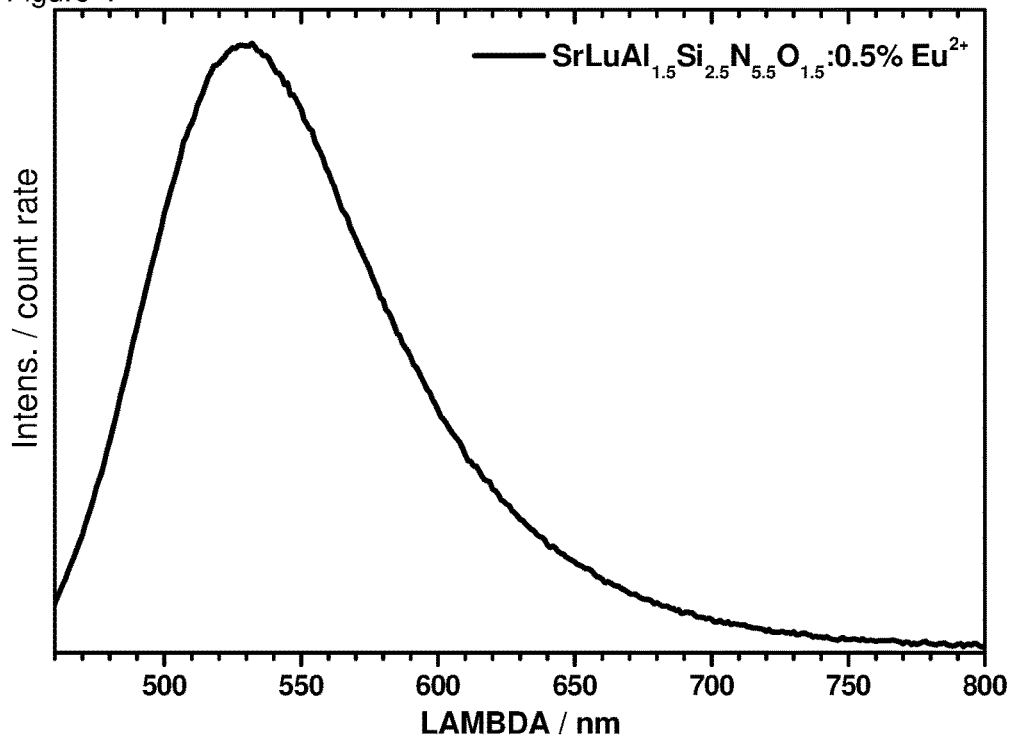
FIG. 4: Emission spectrum of $SrLuAl_{1.5}Si_{2.5}N_{5.5}O_{1.5}$: 0.5% $Eu^{2+}$ from Example 1 ($\lambda_{ex}$=410 nm).
Figure 5:
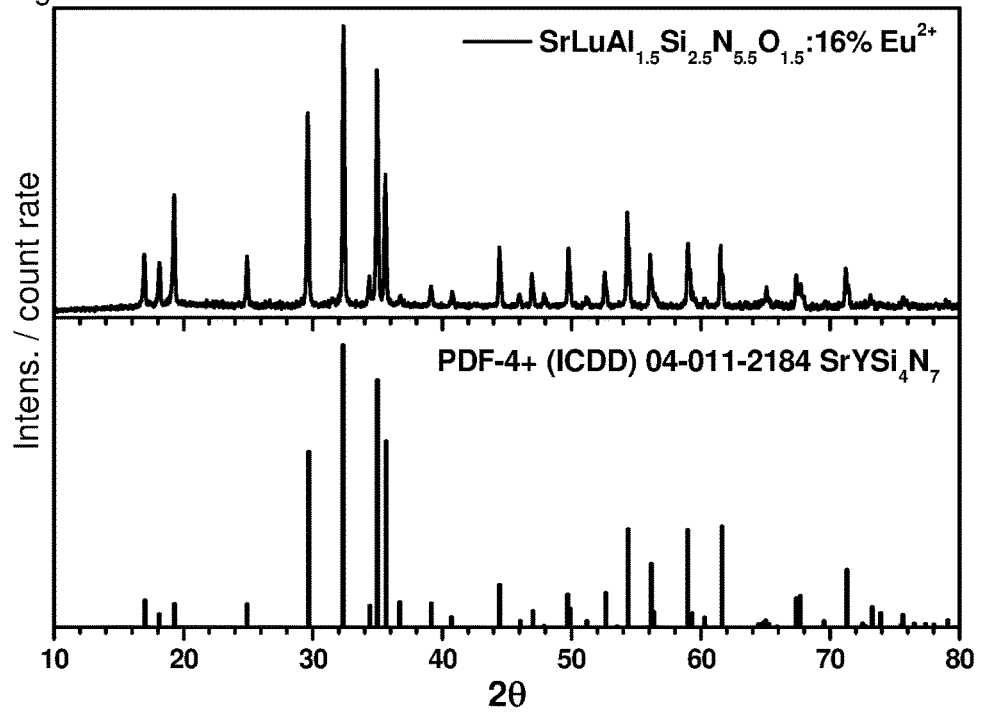
FIG. 5: X-ray powder diffraction pattern of $SrLuAl_{1.5}Si_{2.5}N_{5.5}O_{1.5}$: 16% $Eu^{2+}$ from Example 2.
Figure 6:
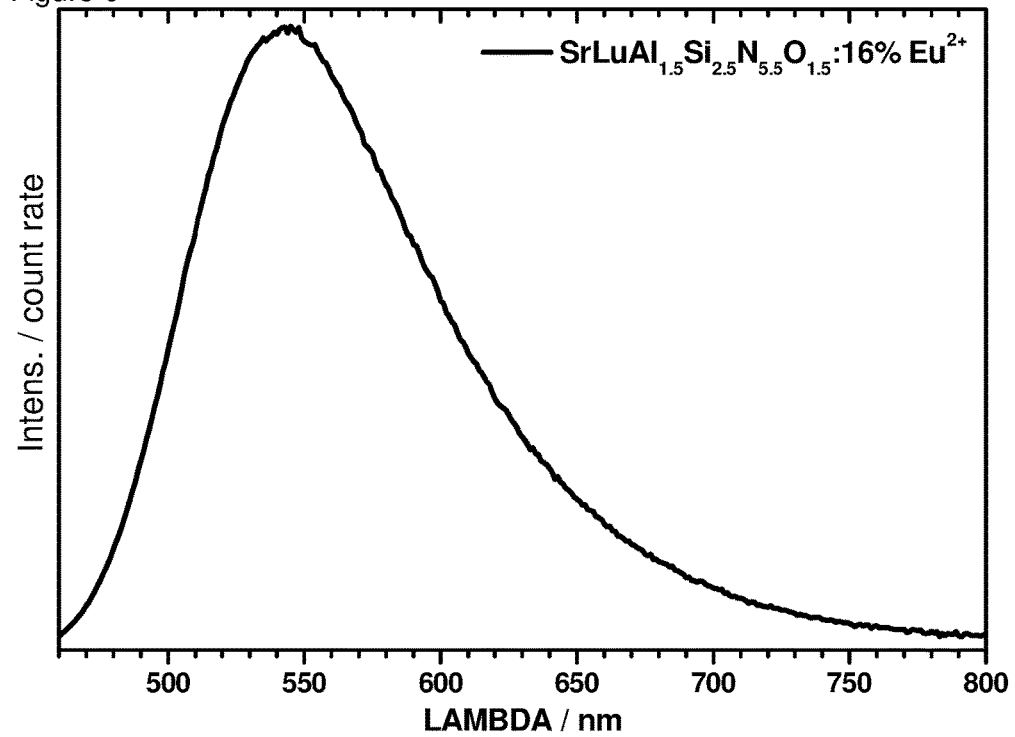
FIG. 6: Emission spectrum of $SrLuAl_{1.5}Si_{2.5}N_{5.5}O_{1.5}$: 6% $Eu^{2+}$ from Example 2 ($\lambda_{ex}$=410 nm).
Figure 7:
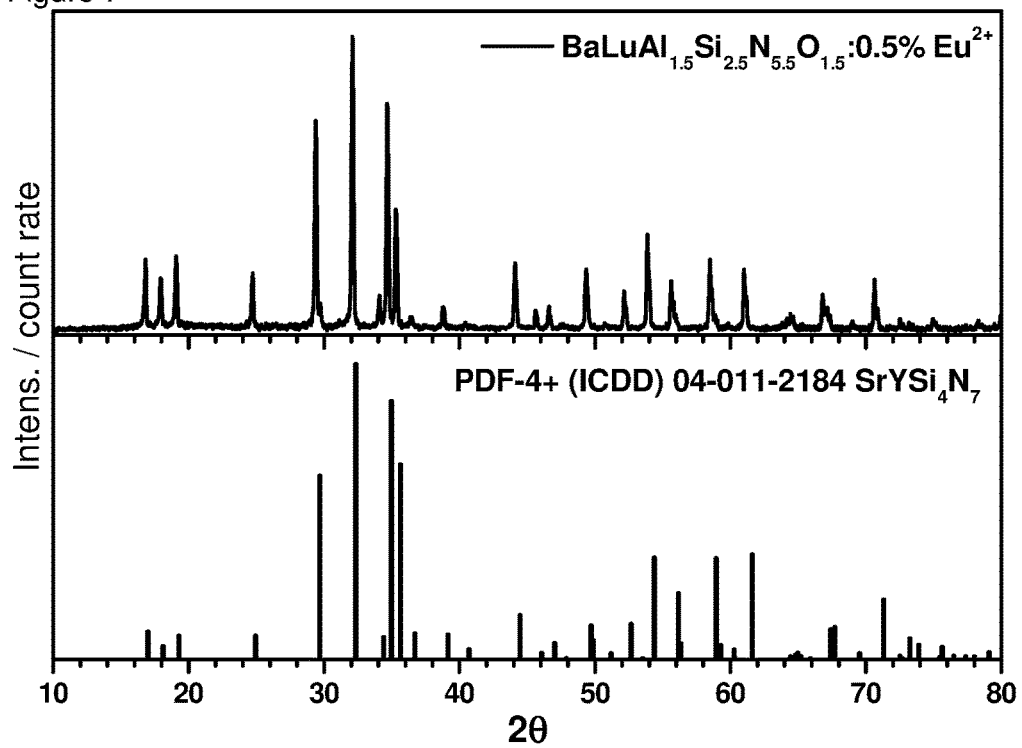
FIG. 7: X-ray powder diffraction pattern of $BaLuAl_{1.5}Si_{2.5}N_{5.5}O_{1.5}$: 0.5% $Eu^{2+}$ from Example 3.
Figure 8:
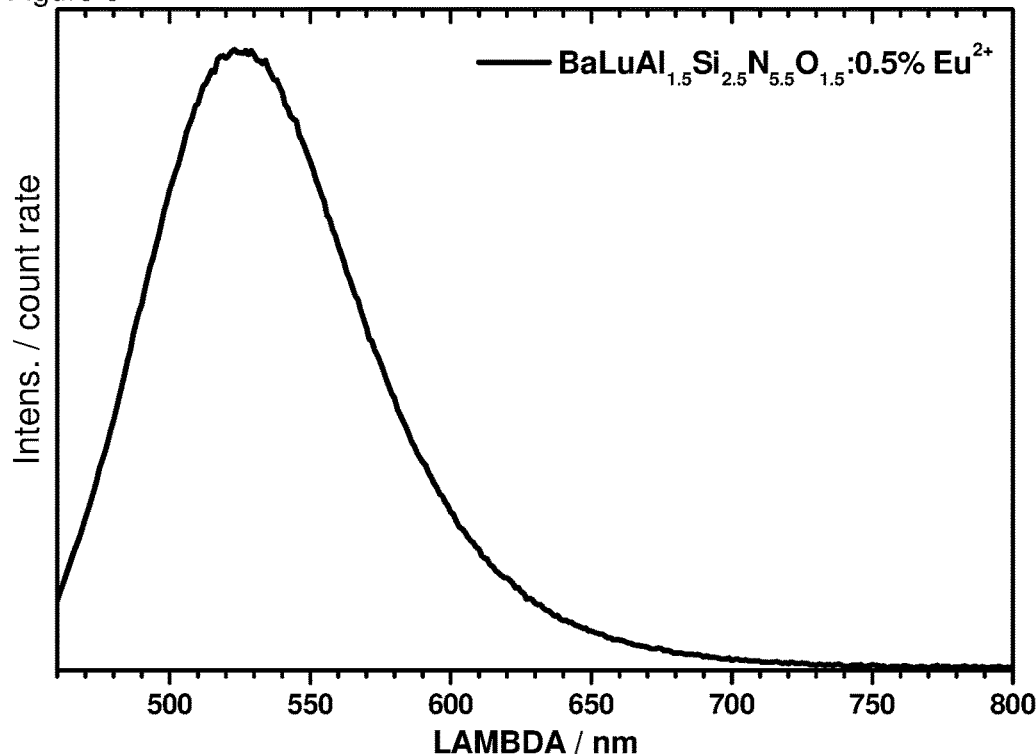
FIG. 8: Emission spectrum of $BaLuAl_{1.5}Si_{2.5}N_{5.5}O_{1.5}$: 0.5% $Eu^{2+}$ from Example 3 ($\lambda_{ex}$=410 nm).
Figure 9:
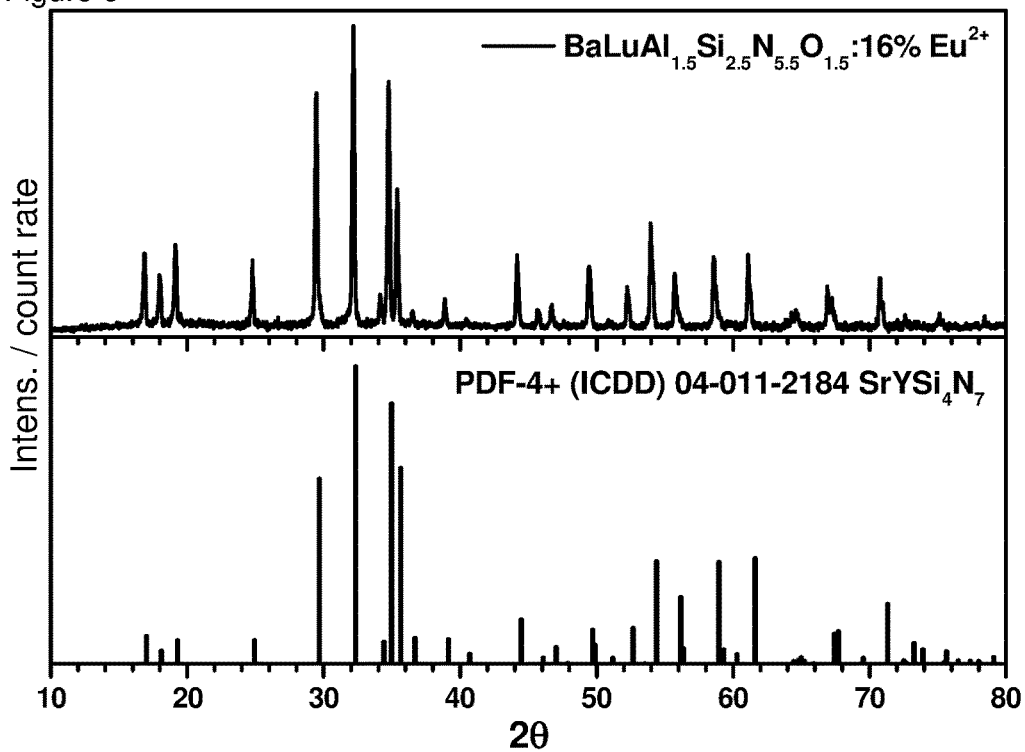
FIG. 9: X-ray powder diffraction pattern of $BaLuAl_{1.5}Si_{2.5}N_{5.5}O_{1.5}$:16% $Eu^{2+}$ from Example 4.
Figure 10:
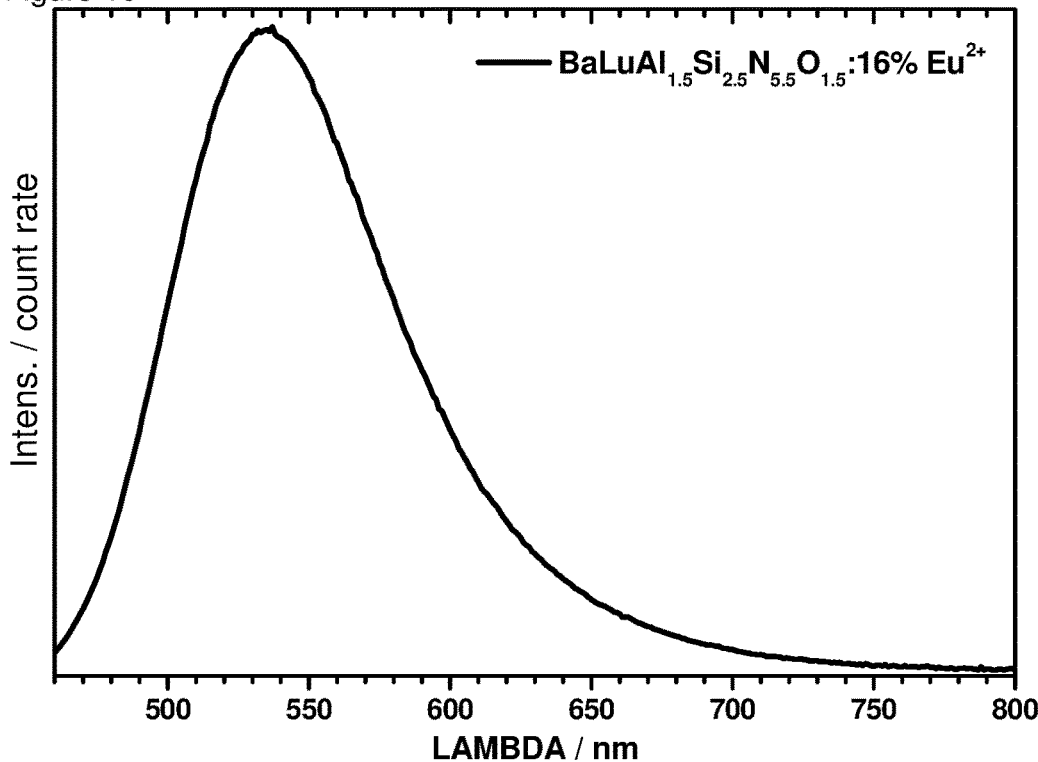
FIG. 10: Emission spectrum of $BaLuAl_{1.5}Si_{2.5}N_{5.5}O_{1.5}$: 16% $Eu^{2+}$ from Example 4 ($\lambda_{ex}$=410 nm).
Figure 11:
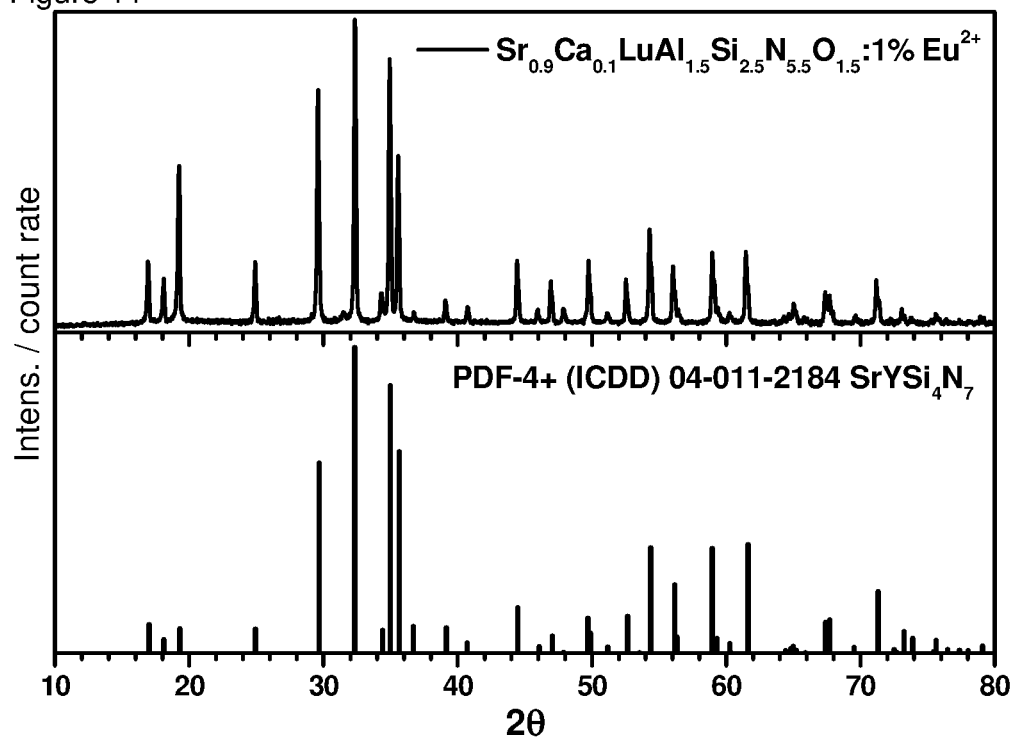
FIG. 11: X-ray powder diffraction pattern of $Sr_{0.9}Ca_{0.1}LuAl_{1.5}Si_{2.5}N_{5.5}O_{1.5}$: 1% $Eu^{2+}$ from Example 5.
Figure 12:
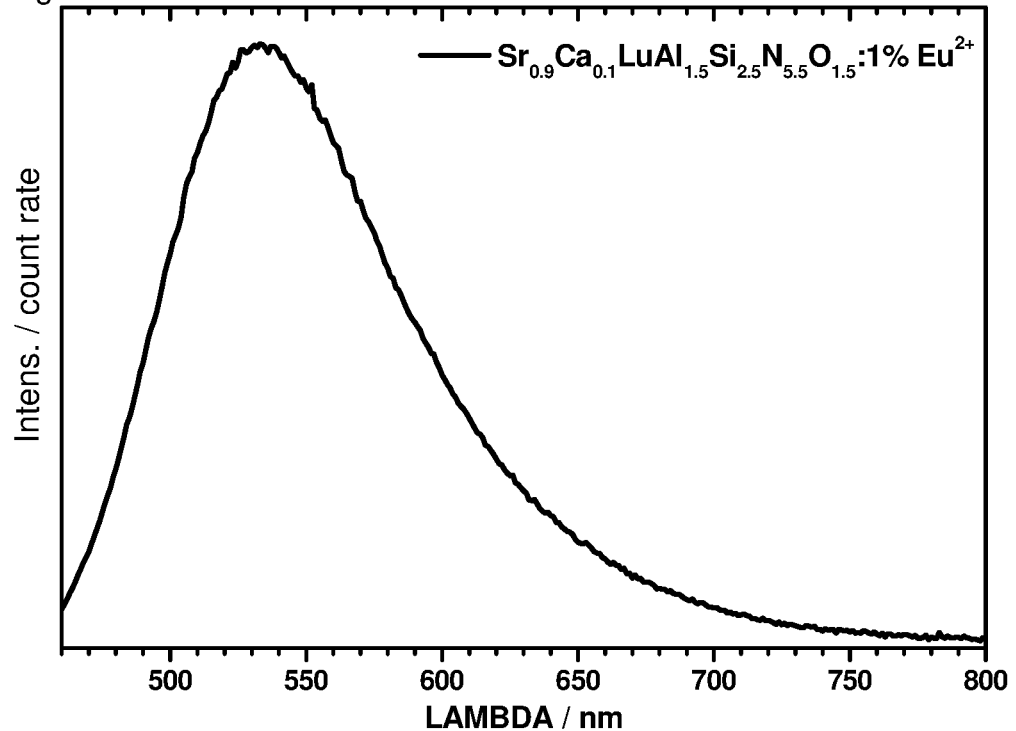
FIG. 12: Emission spectrum of $Sr_{0.9}Ca_{0.1}LuAl_{1.5}Si_{2.5}N_{5.5}O_{1.5}$:1% $Eu^{2+}$ from Example 5 ($\lambda_{ex}$=410 nm).
Figure 13:
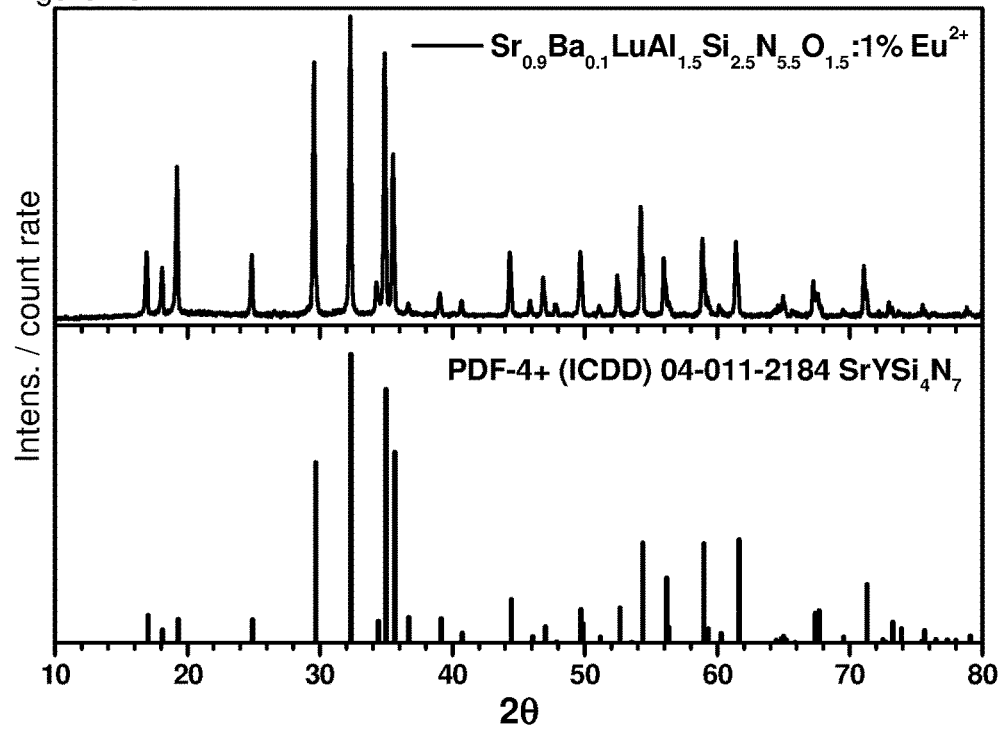
FIG. 13: X-ray powder diffraction pattern of $Sr_{0.9}Ba_{0.1}LuAl_{1.5}Si_{2.5}N_{5.5}O_{1.5}$:1% $Eu^{2+}$ from Example 6.
Figure 14:
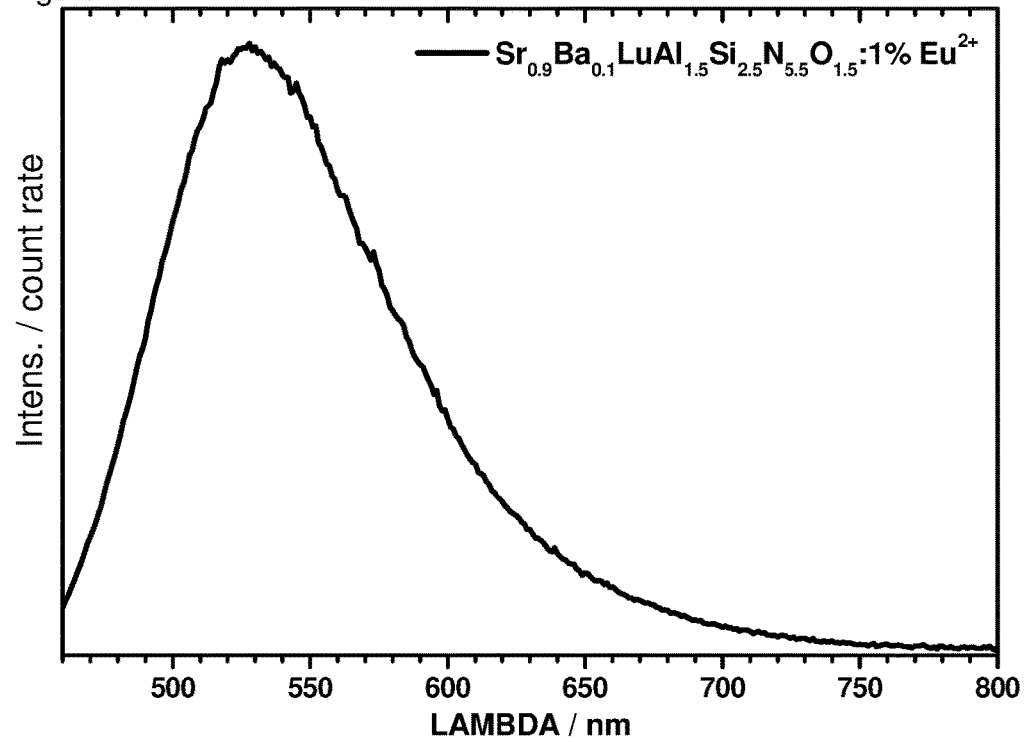
FIG. 14: Emission spectrum of $Sr_{0.9}Ba_{0.1}LuAl_{1.5}Si_{2.5}N_{5.5}O_{1.5}$:1% $Eu^{2+}$ from Example 6 ($\lambda_{ex}$=410 nm).
Figure 15:
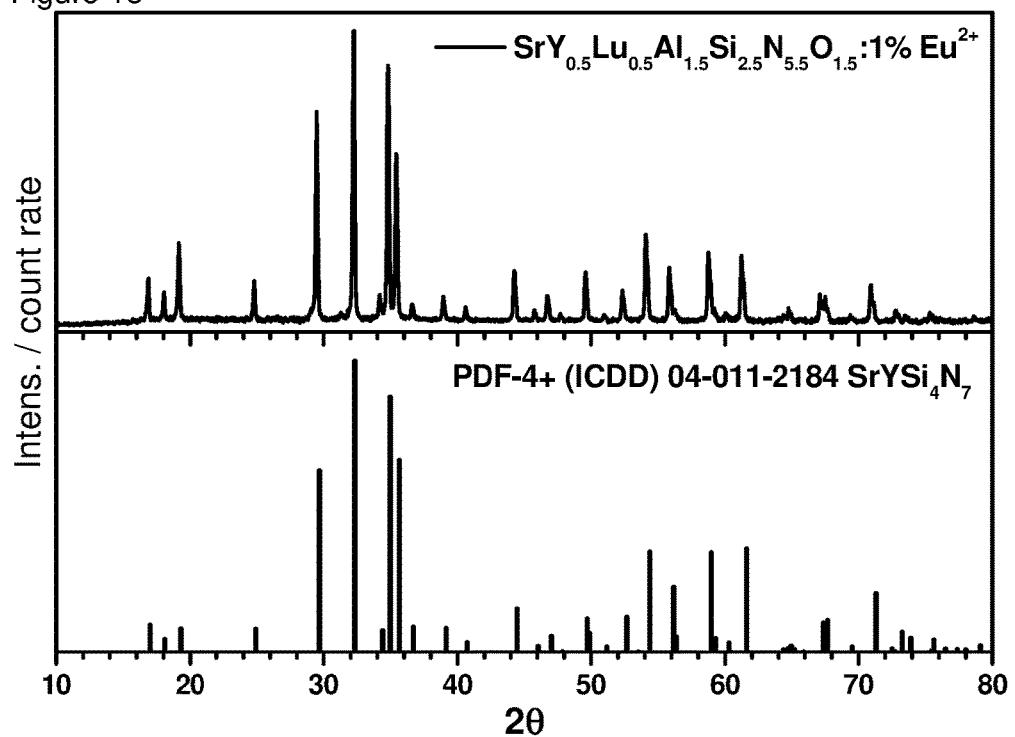
FIG. 15: X-ray powder diffraction pattern of $SrY_{0.5}Lu_{0.5}Al_{1.5}Si_{2.5}N_{5.5}O_{1.5}$:1% $Eu^{2+}$ from Example 7.
Figure 16:
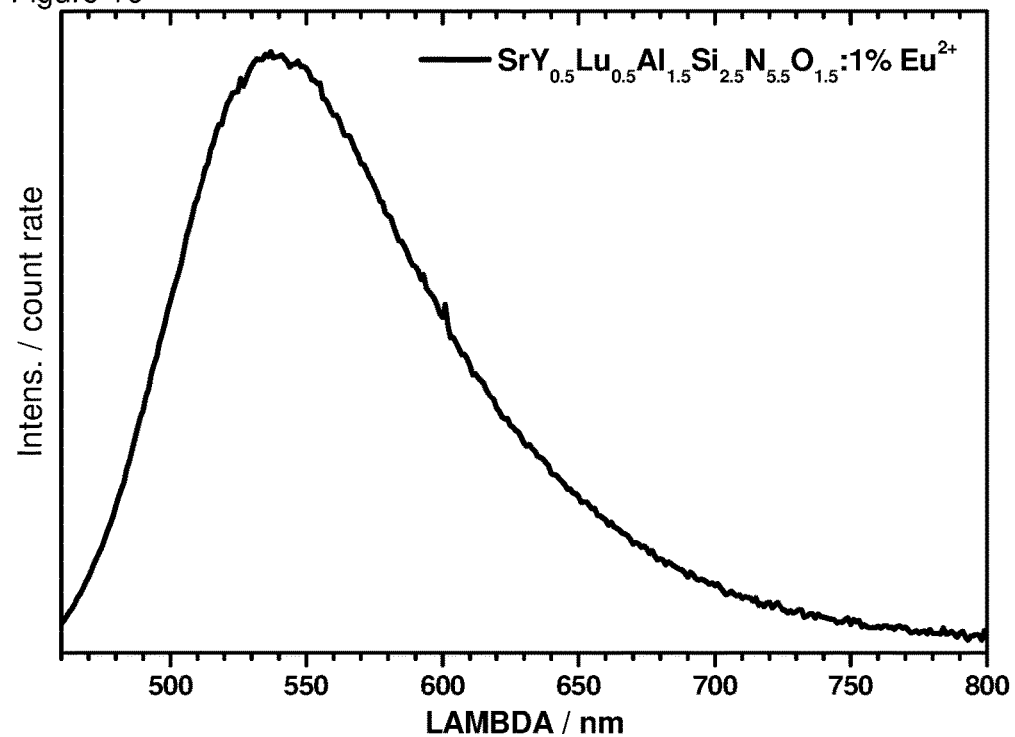
FIG. 16: Emission spectrum of $SrY_{0.5}Lu_{0.5}Al_{1.5}Si_{2.5}N_{5.5}O_{1.5}$:1% $Eu^{2+}$ from Example 7 ($\lambda_{ex}$=410 nm).
Figure 17:
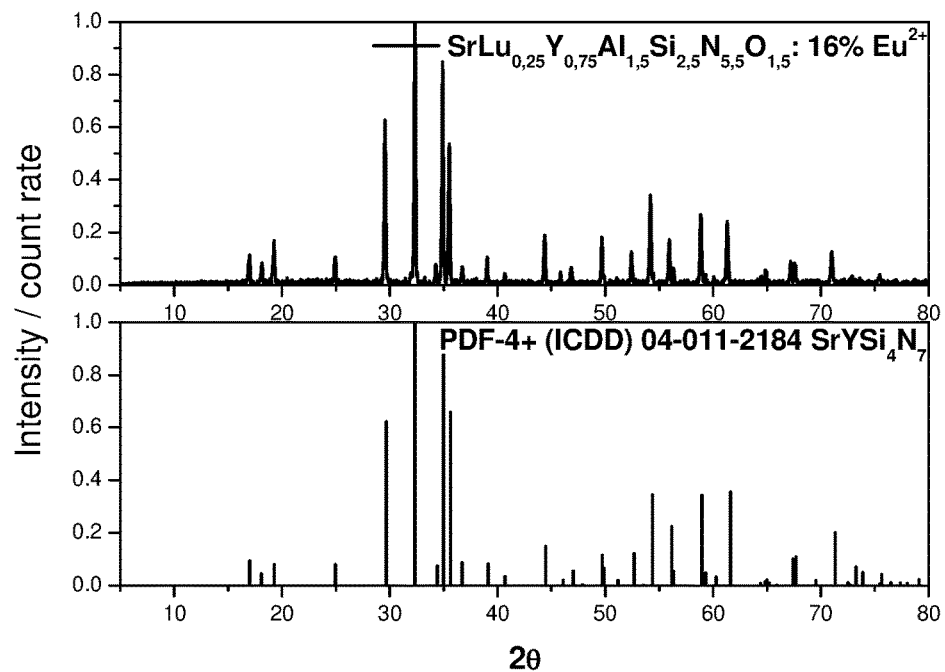
FIG. 17: X-ray powder diffraction pattern of $SrLu_{0.25}Y_{0.75}Al_{1.5}Si_{2.5}N_{5.5}O_{1.5}$:16% $Eu^{2+}$ from Example 8.
Figure 18:
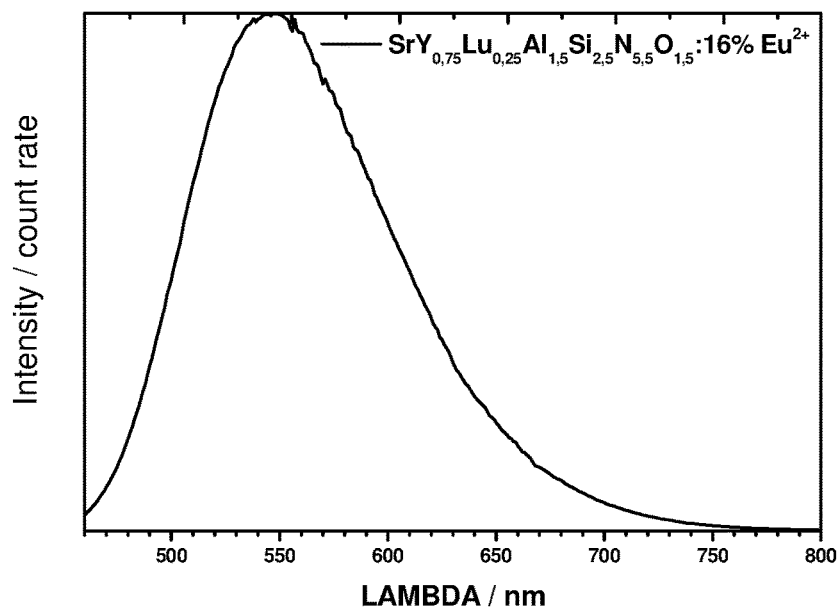
FIG. 18: Emission spectrum of $SrLu_{0.25}Y_{0.75}Al_{1.5}Si_{2.5}N_{5.5}O_{1.5}$: 16% $Eu^{2+}$ from Example 8 ($\lambda_{ex}$=410 nm).
Figure 19:
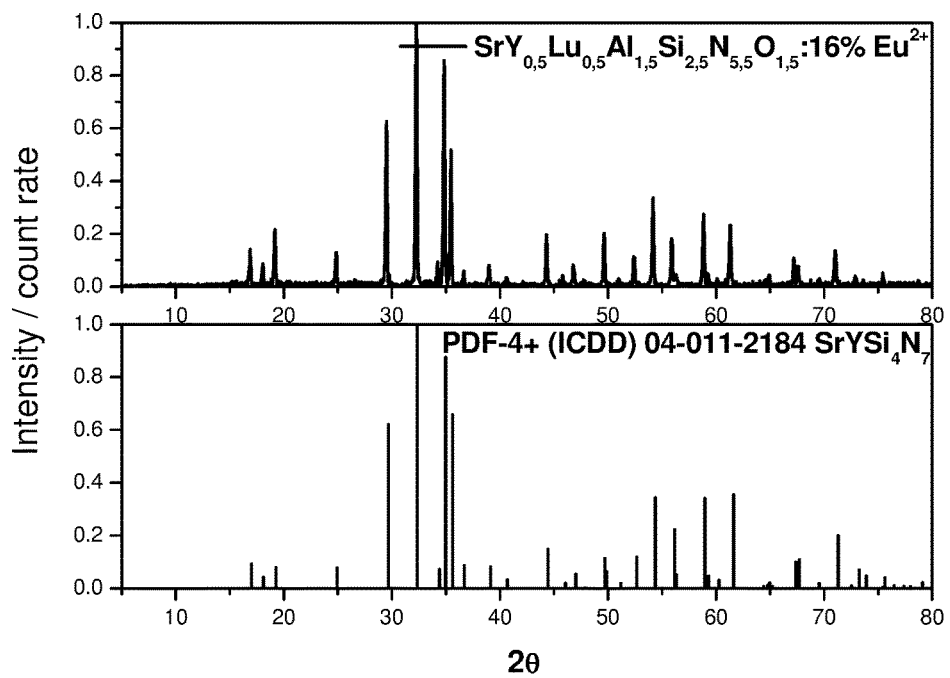
FIG. 19: X-ray powder diffraction pattern of $SrLu_{0.5}Y_{0.5}Al_{1.5}Si_{2.5}N_{5.5}O_{1.5}$: 16% $Eu^{2+}$ from Example 9.
Figure 20:
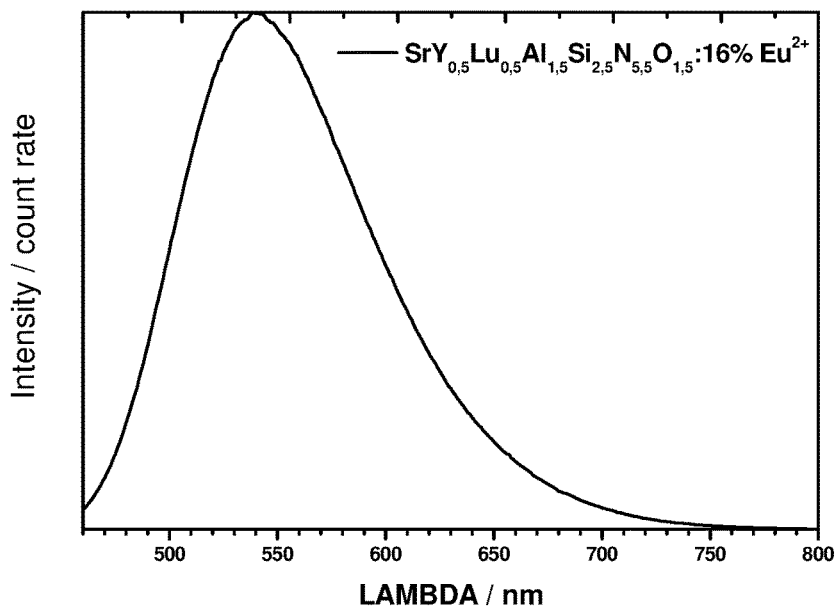
FIG. 20: Emission spectrum of $SrLu_{0.5}Y_{0.5}Al_{1.5}Si_{2.5}N_{5.5}O_{1.5}$:16% $Eu^{2+}$ from Example 9 ($\lambda_{ex}$=410 nm).
Figure 21:
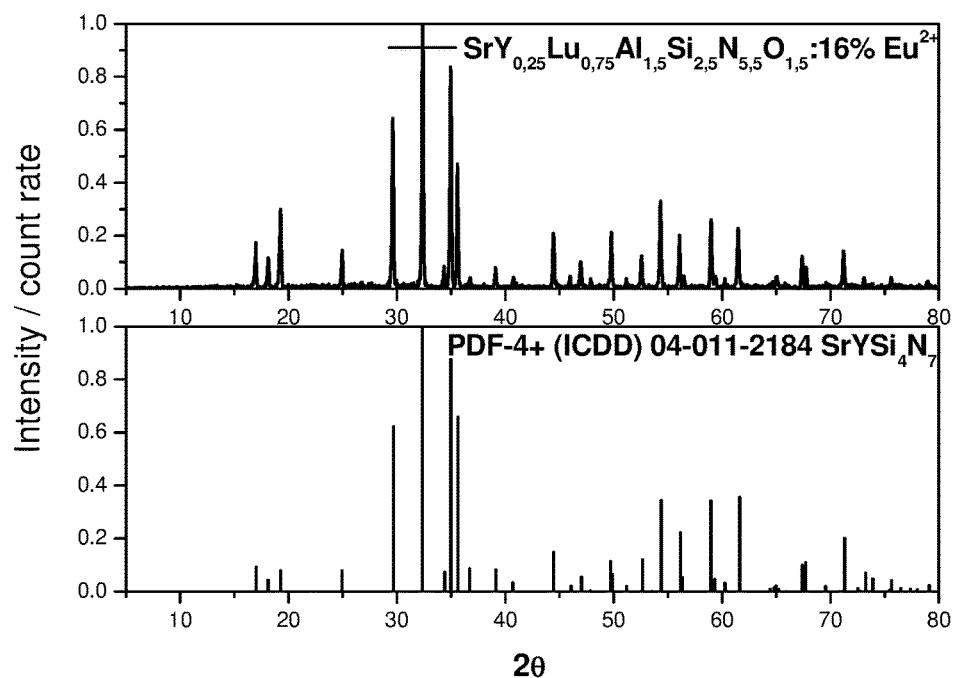
FIG. 21: X-ray powder diffraction pattern of $SrLu_{0.75}Y_{0.25}Al_{1.5}Si_{2.5}N_{5.5}O_{1.5}$:16% $Eu^{2+}$ from Example 10.
Figure 22:
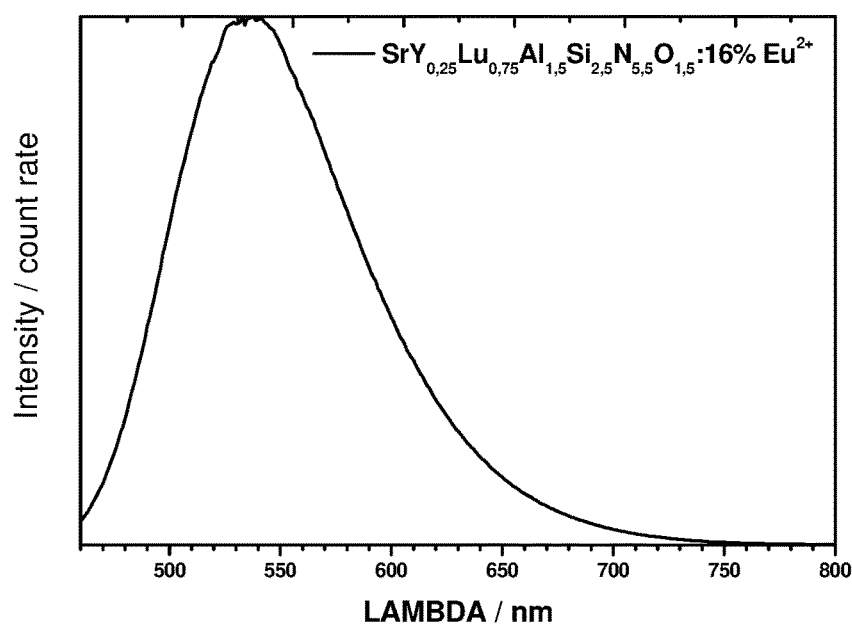
FIG. 22: Emission spectrum of $SrLu_{0.75}Y_{0.25}Al_{1.5}Si_{2.5}N_{5.5}O_{1.5}$:16% $Eu^{2+}$ from Example 10 ($\lambda_{ex}$=410 nm).
Figure 23:
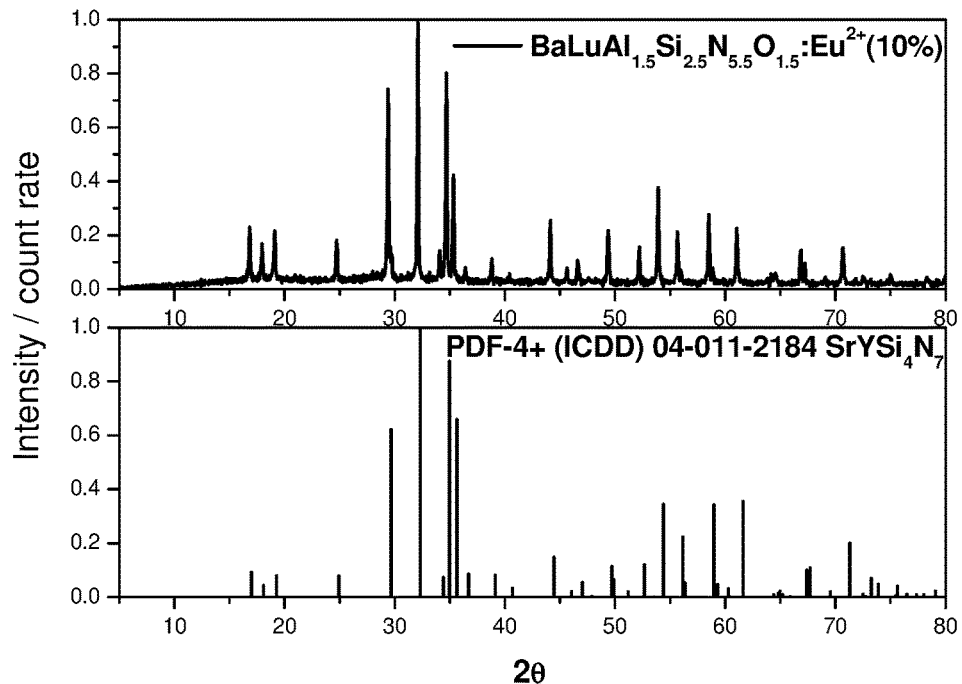
FIG. 23: X-ray powder diffraction pattern of $BaLuAl_{1.5}Si_{2.5}N_{5.5}O_{1.5}$:10% $Eu^{2+}$ from Example 11.
Figure 24:
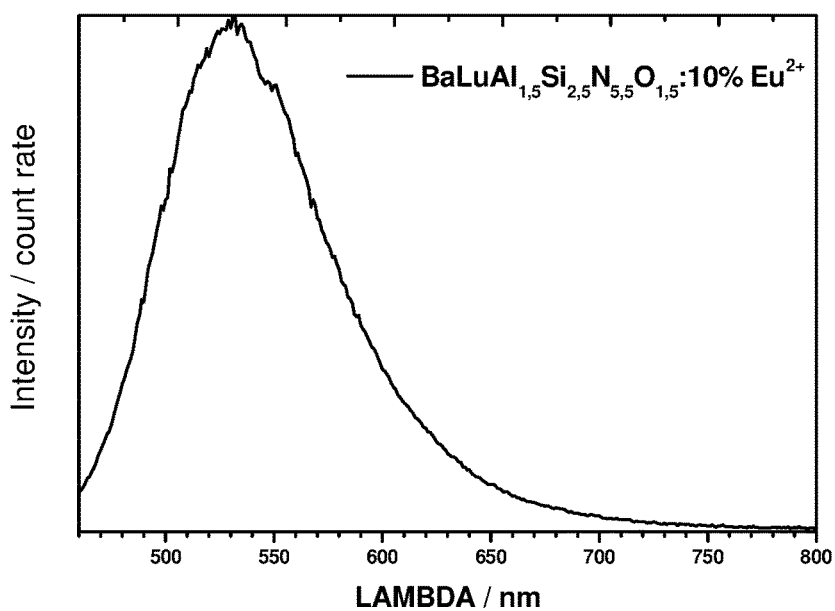
FIG. 24: Emission spectrum of $BaLuAl_{1.5}Si_{2.5}N_{5.5}O_{1.5}$: 10% $Eu^{2+}$ from Example 11 ($\lambda_{ex}$=410 nm).
Figure 25:
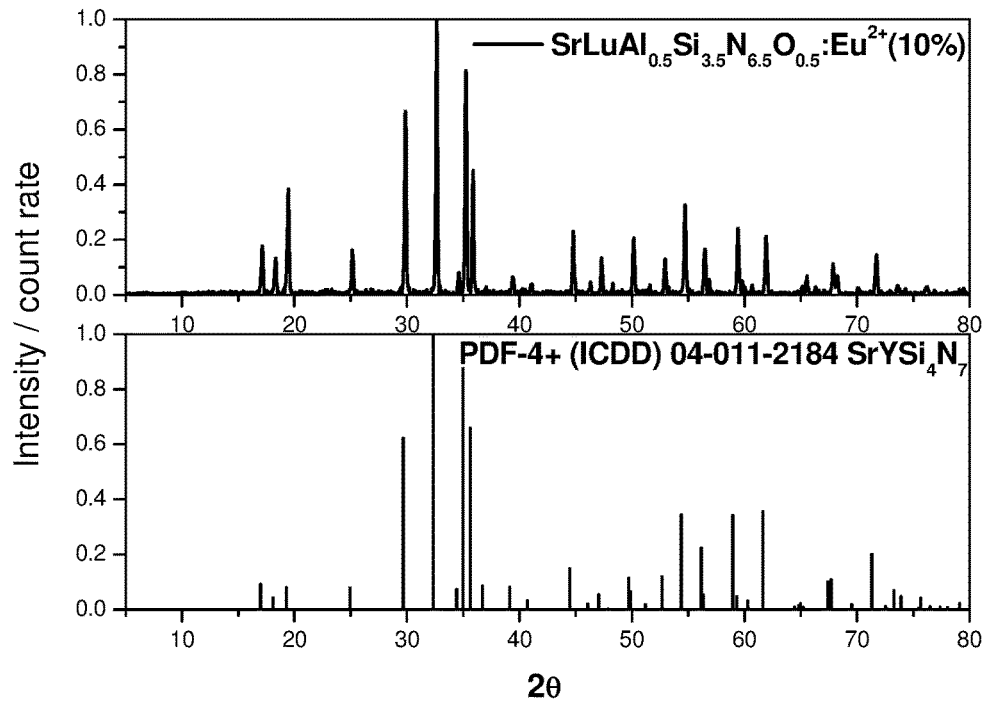
FIG. 25: X-ray powder diffraction pattern of $SrLuAl_{0.5}Si_{3.5}N_{6.5}O_{0.5}$:10% $Eu^{2+}$ from Example 12.
Figure 26:
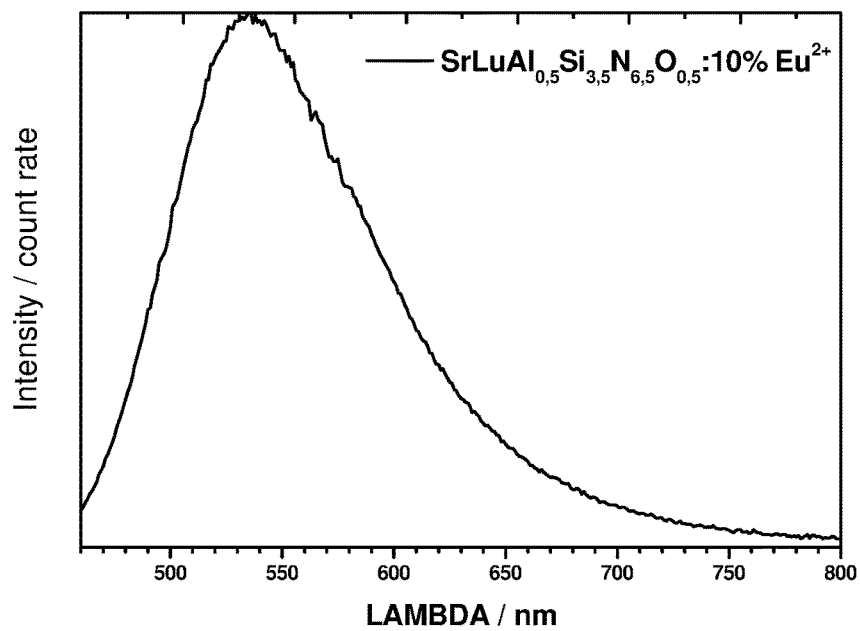
FIG. 26: Emission spectrum of $SrLuAl_{0.5}Si_{3.5}N_{6.5}O_{0.5}$: 10% $Eu^{2+}$ from Example 12 ($\lambda_{ex}$=410 nm).
Figure 27:
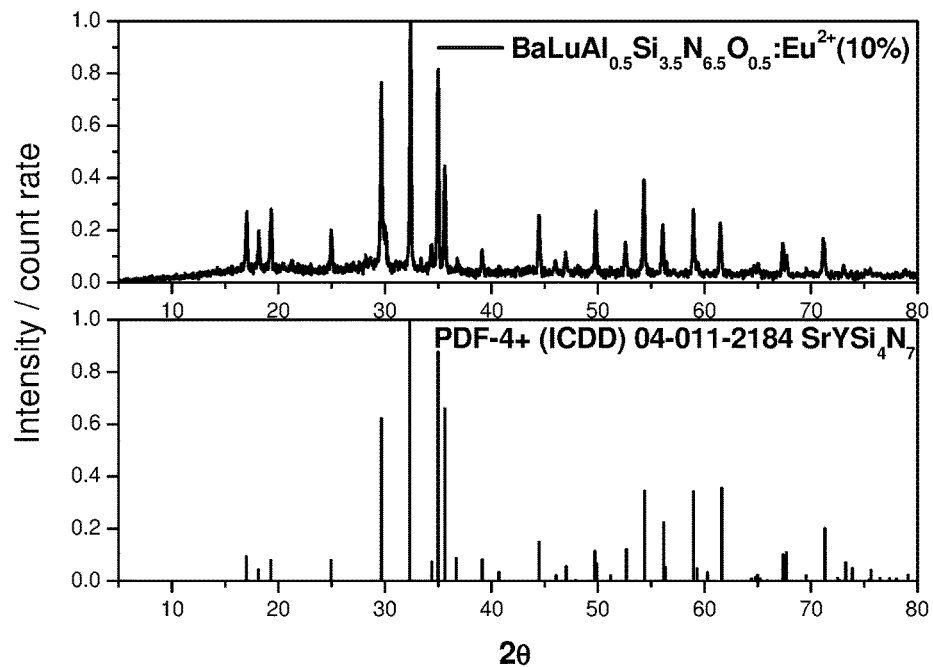
FIG. 27: X-ray powder diffraction pattern of $BaLuAl_{0.5}Si_{3.5}N_{6.5}O_{0.5}$:10% $Eu^{2+}$ from Example 13.
Figure 28:
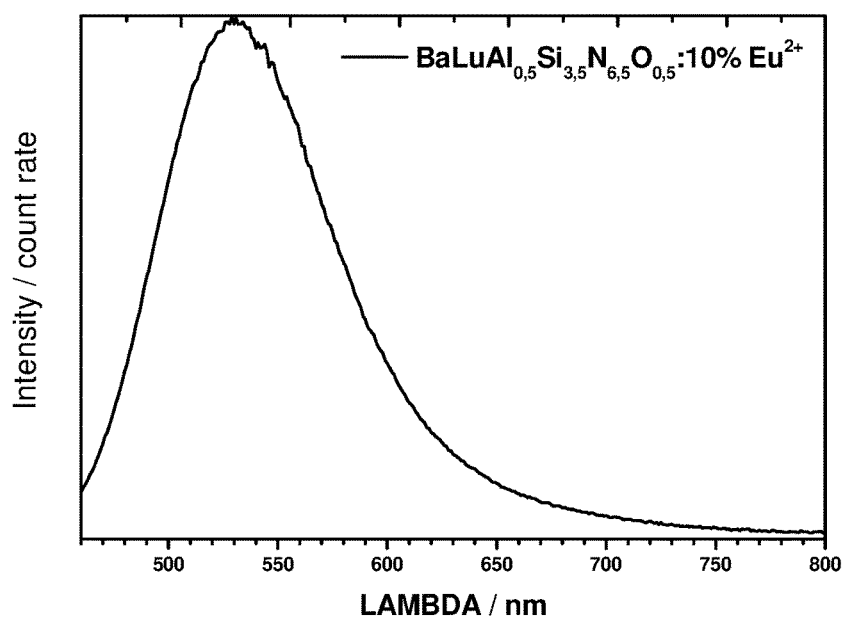
FIG. 28: Emission spectrum of $BaLuAl_{0.5}Si_{3.5}N_{6.5}O_{0.5}$: 10% $Eu^{2+}$ from Example 13 ($\lambda_{ex}$=410 nm).
Figure 29:
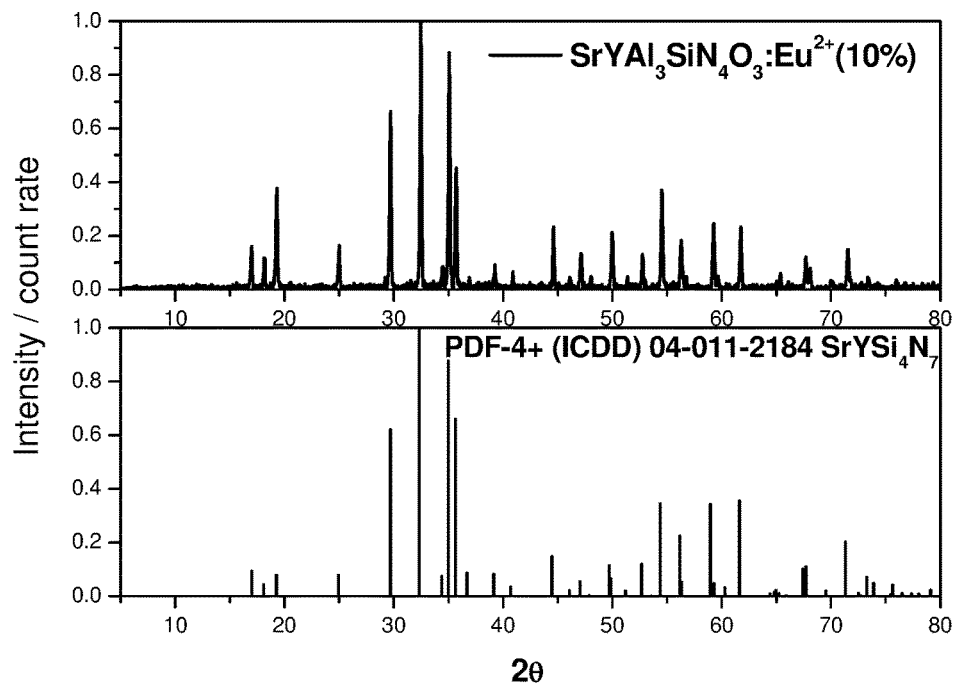
FIG. 29: X-ray powder diffraction pattern of $SrYAl_3SiN_4O_3$:10% $Eu^{2+}$ from Example 14.
Figure 30:
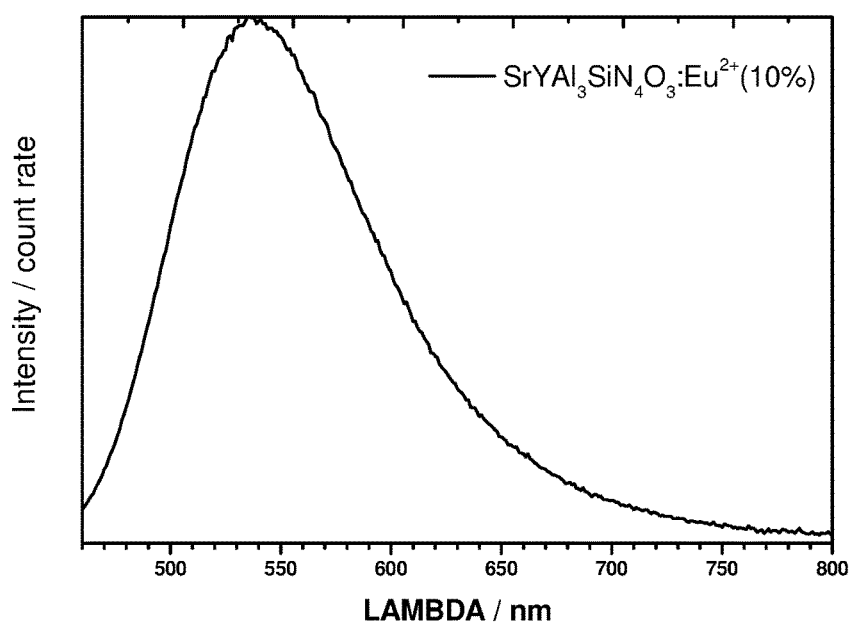
FIG. 30: Emission spectrum of $SrYAl_3SiN_4O_3$:10% $Eu^{2+}$ from Example 14 ($\lambda_{ex}$=410 nm).
Figure 31:
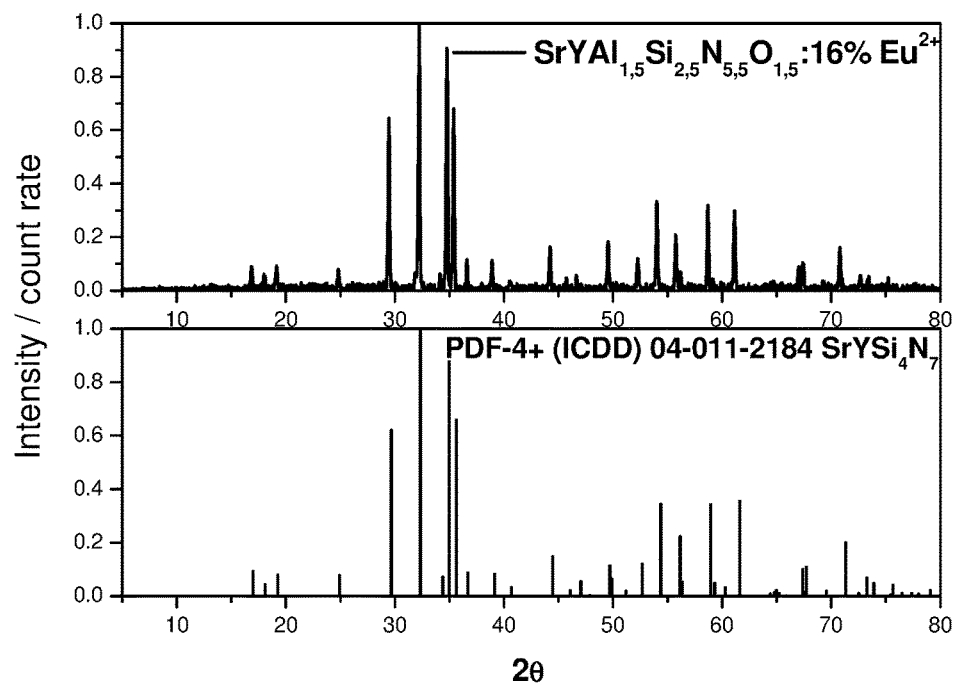
FIG. 31: X-ray powder diffraction pattern of $SrYAl_{1.5}Si_{2.5}N_{5.5}O_{1.5}$:16% $Eu^{2+}$ from Example 15.
Figure 32:
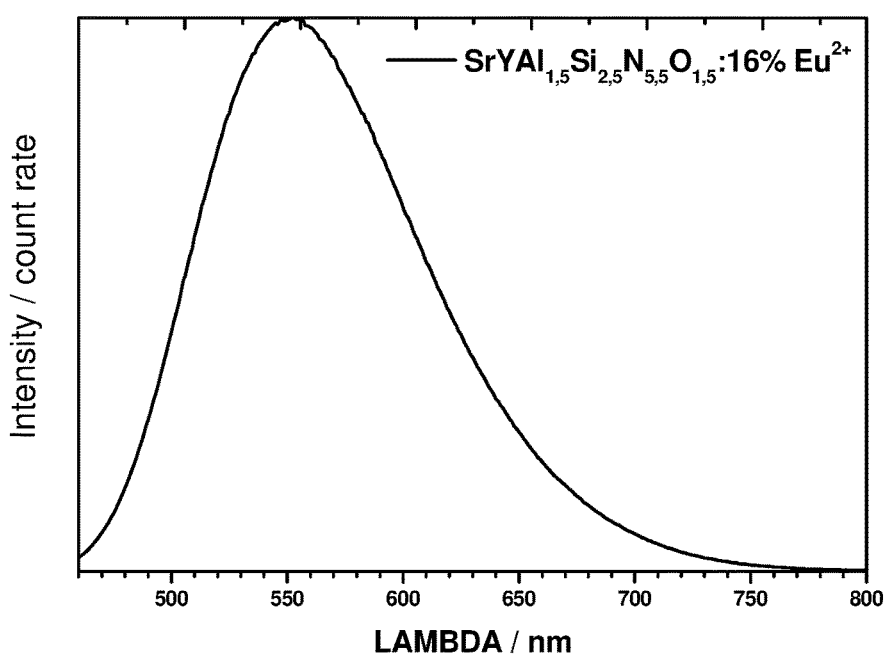
FIG. 32: Emission spectrum of $SrYAl_{1.5}Si_{2.5}N_{5.5}O_{1.5}$: 16% $Eu^{2+}$ from Example 15 ($\lambda_{ex}$=410 nm).
Figure 33:
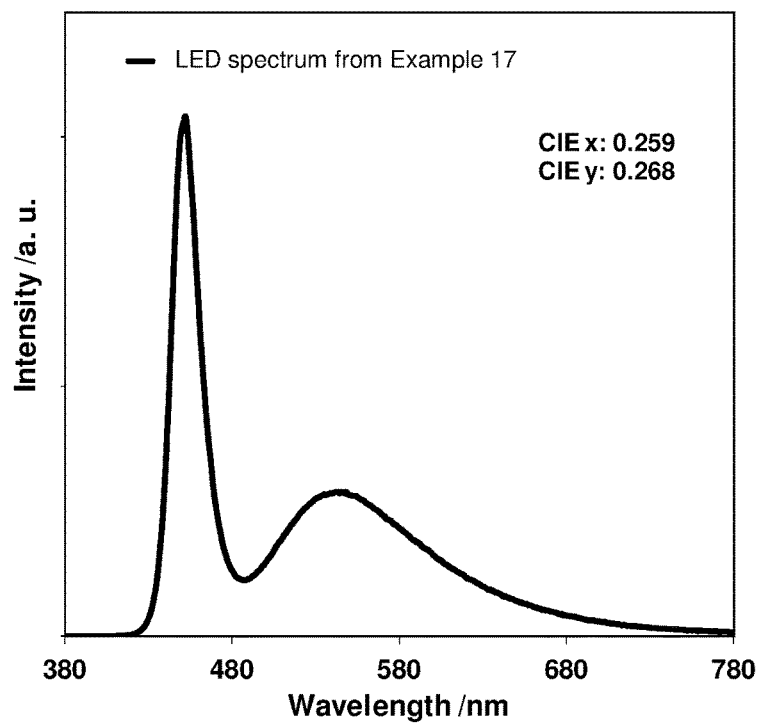
FIG. 33: LED spectrum of the LED from Example 17 with the phosphor $SrLuAl_{1.5}Si_{2.5}N_{5.5}O_{1.5}$:$Eu^{2+}$ (16%).
Figure 34:
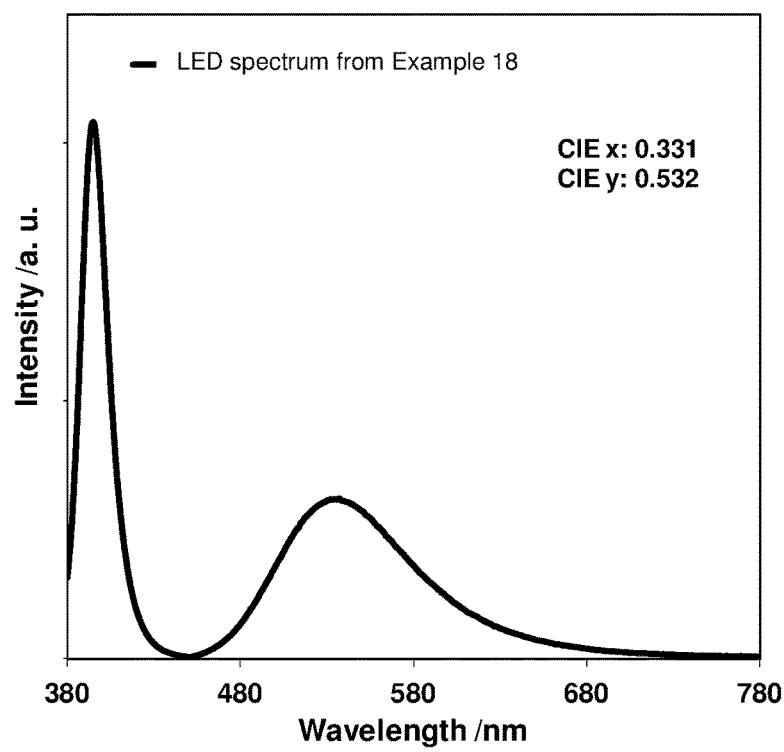
FIG. 34: LED spectrum of the LED from Example 18 with the phosphor $BaLuAl_{1.5}Si_{2.5}N_{5.5}O_{1.5}$:$Eu^{2+}$ (16%).
Figure 35:
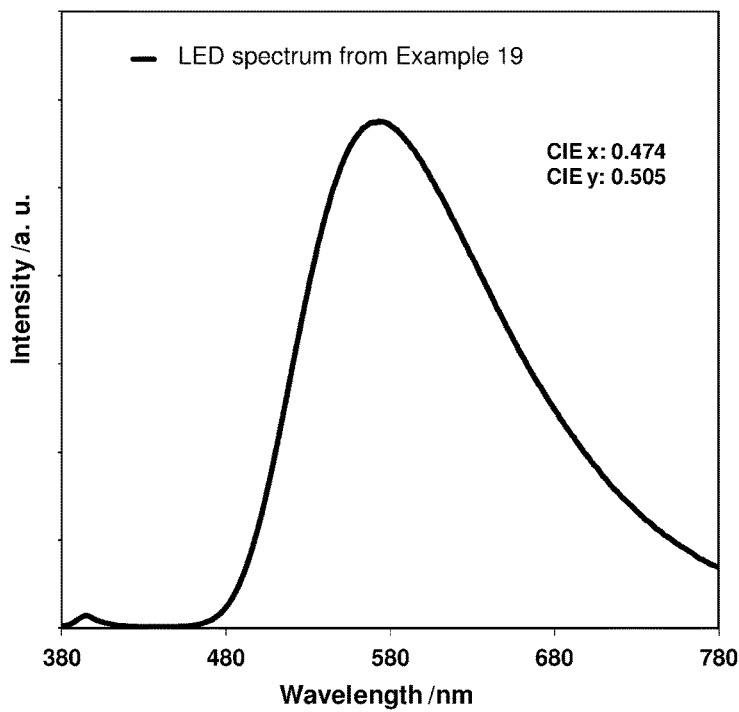
FIG. 35: LED spectrum of the LED from Example 19 with the phosphor $Sr_{0.84}YSi_{2.5}Al_{1.5}N_{5.5}O_{1.5}$:$Eu^{2+}$ (16%).
Figure 36:
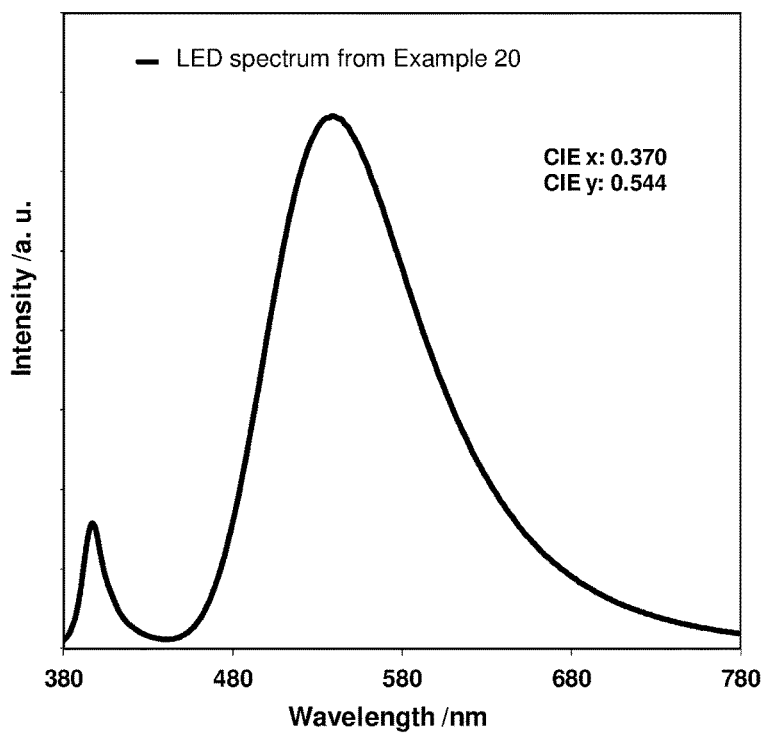
FIG. 36: LED spectrum of the LED from Example 20 with the phosphor $Sr_{0.9}YSiAl_3O_3N_4$:$Eu^{2+}$ (10%).
Figure 37:
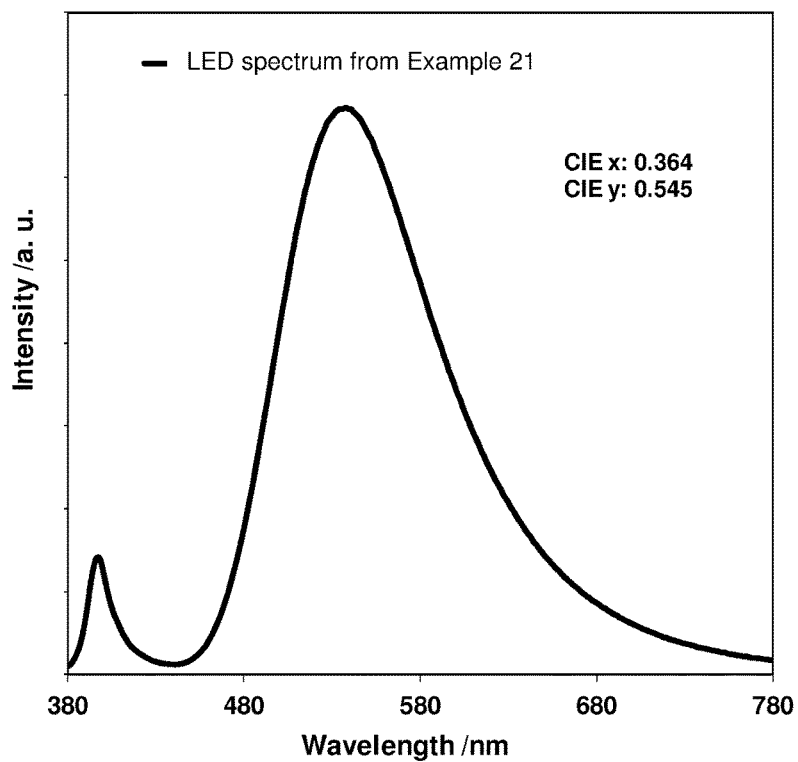
FIG. 37: LED spectrum of the LED from Example 21 with the phosphor $Sr_{0.9}LuSi_{3.5}Al_{0.5}O_{0.5}N_{6.5}$:$Eu^{2+}$ (10%).
Figure 38:
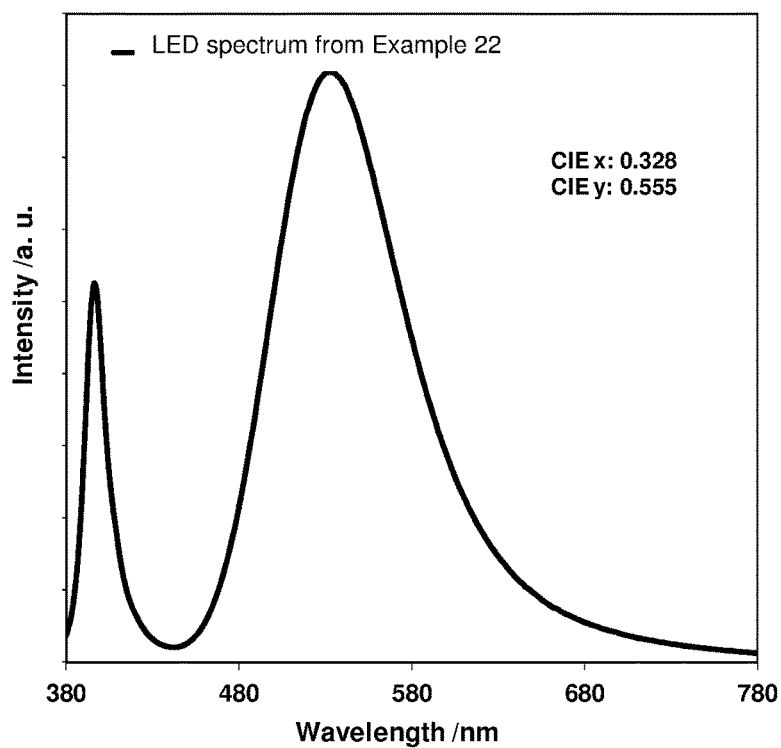
FIG. 38: LED spectrum of the LED from Example 22 with the phosphor $Ba_{0.9}LuSi_{3.5}Al_{0.5}O_{0.5}N_{6.5}$:$Eu^{2+}$ (10%).

General Procedure for Measurement of the Emission

The powder emission spectra are measured by the following general method: a loose phosphor powder bed having a depth of 5 mm whose surface has been smoothed using a glass plate is irradiated at a wavelength of 450 nm in the integration sphere of an Edinburgh Instruments FL 920 fluorescence spectrometer having a xenon lamp as excitation light source, and the intensity of the emitted fluorescence radiation is measured in a range from 465 nm to 800 nm in 1 nm steps.

Example 1: $SrLuAl_{1.5}Si_{2.5}N_{5.5}O_{1.5}$:$Eu^{2+}$ (0.5%)

0.0175 g (0.11 mmol) of EuN, 2.0326 g (6.99 mmol) of $Sr_3N_2$, 1.2954 g (31.60 mmol) of AlN, 4.1920 g (10.53 mmol) of $Lu_2O_3$ and 2.4631 g (17.56 mmol) of $Si_3N_4$ are mixed thoroughly in an agate mortar in a nitrogen-filled glove box. The resultant mixture of the starting compounds is transferred into a boron nitride boat and calcined at 1600° C. for 8 h in an $N_2/H_2$ stream (10% forming gas).

Example 2: $SrLuAl_{1.5}Si_{2.5}N_{5.5}O_{1.5}$:$Eu^{2+}$ (16%)

0.5480 g (3.30 mmol) of EuN, 1.6806 g (5.78 mmol) of $Sr_3N_2$, 1.2687 g (30.95 mmol) of AlN, 4.1057 g (10.32 mmol) of $Lu_2O_3$ and 2.4124 g (17.20 mmol) of $Si_3N_4$ are mixed thoroughly in an agate mortar in a nitrogen-filled glove box. The resultant mixture of the starting compounds is transferred into a boron nitride boat and calcined at 1600° C. for 8 h in an $N_2/H_2$ stream (10% forming gas).

Example 3: $BaLuAl_{1.5}Si_{2.5}N_{5.5}O_{1.5}:Eu^{2+}$ (0.5%)

0.0158 g (0.095 mmol) of EuN, 2.7845 g (6.33 mmol) of $Ba_3N_2$, 1.1731 g (28.62 mmol) of AlN, 3.7964 g (9.54 mmol) of $Lu_2O_3$ and 2.2306 g (15.90 mmol) of $Si_3N_4$ are mixed thoroughly in an agate mortar in a nitrogen-filled glove box. The resultant mixture of the starting compounds is transferred into a boron nitride boat and calcined at 1600° C. for 8 h in an $N_2/H_2$ stream (10% forming gas).

Example 4: $BaLuAl_{1.5}Si_{2.5}N_{5.5}O_{1.5}:Eu^{2+}$ (16%)

0.5045 g (3.04 mmol) of EuN, 2.3406 g (5.32 mmol) of $Ba_3N_2$, 1.1681 g (28.50 mmol) of AlN, 3.7800 g (9.50 mmol) of $Lu_2O_3$ and 2.2210 g (15.83 mmol) of $Si_3N_4$ are mixed thoroughly in an agate mortar in a nitrogen-filled glove box. The resultant mixture of the starting compounds is transferred into a boron nitride boat and calcined at 1600° C. for 8 h in an $N_2/H_2$ stream (10% forming gas).

Example 5: $Sr_{0.9}Ca_{0.1}LuAl_{1.5}Si_{2.5}N_{5.5}O_{1.5}:Eu^{2+}$ (1%)

0.0353 g (0.21 mmol) of EuN, 1.8352 g (6.31 mmol) of $Sr_3N_2$, 0.1051 g (0.71 mmol) of $Ca_3N_2$, 1.3076 g (31.90 mmol) of AlN, 4.2315 g (10.63 mmol) of $Lu_2O_3$ and 2.4863 g (17.72 mmol) of $Si_3N_4$ are mixed thoroughly in an agate mortar in a nitrogen-filled glove box. The resultant mixture of the starting compounds is transferred into a boron nitride boat and calcined at 1600° C. for 8 h in an $N_2/H_2$ stream (10% forming gas).

Example 6: $Sr_{0.9}Ba_{0.1}LuAl_{1.5}Si_{2.5}N_{5.5}O_{1.5}:Eu^{2+}$ (1%)

0.0346 g (0.21 mmol) of EuN, 1.7980 g (6.18 mmol) of $Sr_3N_2$, 0.3056 g (0.69 mmol) of $Ba_3N_2$, 1.2811 g (31.25 mmol) of AlN, 4.1458 g (10.42 mmol) of $Lu_2O_3$ and 2.4359 g (17.36 mmol) of $Si_3N_4$ are mixed thoroughly in an agate mortar in a nitrogen-filled glove box. The resultant mixture of the starting compounds is transferred into a boron nitride boat and calcined at 1600° C. for 8 h in an $N_2/H_2$ stream (10% forming gas).

Example 7: $SrY_{0.5}Lu_{0.5}Al_{1.5}Si_{2.5}N_{5.5}O_{1.5}:Eu^{2+}$ (1%)

0.0384 g (0.23 mmol) of EuN, 2.2223 g (7.64 mmol) of $Sr_3N_2$, 1.4235 g (34.73 mmol) of AlN, 1.3070 g (5.79 mmol) of $Y_2O_3$, 2.3032 g (5.79 mmol) of $Lu_2O_3$ and 2.7066 g (19.29 mmol) of $Si_3N_4$ are mixed thoroughly in an agate mortar in a nitrogen-filled glove box. The resultant mixture of the starting compounds is transferred into a boron nitride boat and calcined at 1600° C. for 8 h in an $N_2/H_2$ stream (10% forming gas).

Example 8: $SrLu_{0.25}Y_{0.75}Al_{1.5}Si_{2.5}N_{5.5}O_{1.5}:16\% Eu^{2+}$ 0.3793 g (2.29 mmol) of EuN, 1.1633 g (3.02 mmol) of $Sr_3N_2$, 0.8782 g (21.43 mmol) of AlN, 0.7105 g (1.79 mmol) of $Lu_2O_3$, 1.2095 g (5.36 mmol) of $Y_2O_3$ and 1.6698 g (11.90 mmol) of $Si_3N_4$ are ground intimately together in a mortar. The resultant mixture of the starting compounds is transferred into a boron nitride boat and calcined at 1600° C. for 8 h in an $N_2/H_2$ stream (10% forming gas). All manipulations of the starting materials are carried out in an $N_2$-filled glove box.

Example 9: $SrLu_{0.5}Lu_{0.5}Al_{1.5}Si_{2.5}N_{5.5}O_{1.5}:16\% Eu^{2+}$ 0.1897 g (1.14 mmol) of EuN, 0.5817 g (2.00 mmol) of $Sr_3N_2$, 0.4391 g (10.71 mmol) of AlN, 1.3552 g (3.41 mmol) of $Lu_2O_3$, 0.6048 g (2.68 mmol) of $Y_2O_3$ and 0.8349 g (5.95 mmol) of $Si_3N_4$ are ground intimately together in a mortar. The resultant mixture of the starting compounds is transferred into a boron nitride boat and calcined at 1600° C. for 8 h in an $N_2/H_2$ stream (10% forming gas). All manipulations of the starting materials are carried out in an $N_2$-filled glove box.

Example 10: $SrLu_{0.75}Y_{0.25}Al_{1.5}Si_{2.5}N_{5.5}O_{1.5}:16\% Eu^{2+}$ 0.3441 g (2.07 mmol) of EuN, 1.0552 g (3.63 mmol) of $Sr_3N_2$, 0.7966 g (19.43 mmol) of AlN, 1.9334 g (4.86 mmol) of $Lu_2O_3$, 0.3657 g (1.62 mmol) of $Y_2O_3$ and 1.5146 g (10.80 mmol) of $Si_3N_4$ are ground intimately together in a mortar. The resultant mixture of the starting compounds is transferred into a boron nitride boat and calcined at 1600° C. for 8 h in an $N_2/H_2$ stream (10% forming gas). All manipulations of the starting materials are carried out in an $N_2$-filled glove box.

Example 11: $BaLuAl_{1.5}Si_{2.5}N_{5.5}O_{1.5}:10\% Eu^{2+}$ 0.0948 g (0.57 mmol) of EuN, 0.7536 g (1.71 mmol) of $Ba_3N_2$, 0.3510 g (8.56 mmol) of AlN, 1.1359 g (2.85 mmol) of $Lu_2O_3$ and 0.6674 g (4.76 mmol) of $Si_3N_4$ are ground intimately together in a mortar. The resultant mixture of the starting compounds is transferred into a boron nitride boat and calcined at 1600° C. for 8 h in an $N_2/H_2$ stream (10% forming gas). All manipulations of the starting materials are carried out in an $N_2$-filled glove box.

Example 12: $SrLuAl_{0.5}Si_{3.5}N_{6.5}O_{0.5}:10\% Eu^{2+}$ 0.1384 g (0.83 mmol) of EuN, 0.7274 g (6.70 mmol) of $Sr_3N_2$, 0.1708 g (4.17 mmol) of AlN, 0.5173 g (1.30 mmol) of $Lu_2O_3$, 1.2661 g (6.70 mmol) of LuN and 1.3643 g (9.73 mmol) of $Si_3N_4$ are ground intimately together in a mortar. The resultant mixture of the starting compounds is transferred into a boron nitride boat and calcined at 1600° C. for 8 h in an $N_2/H_2$ stream (10% forming gas). All manipulations of the starting materials are carried out in an $N_2$-filled glove box.

Example 13: $BaLuAl_{0.5}Si_{3.5}N_{6.5}O_{0.5}:10\% Eu^{2+}$ 0.1266 g (0.76 mmol) of EuN, 1.0065 g (2.29 mmol) of $Ba_3N_2$, 0.1563 g (3.81 mmol) of AlN, 0.0504 g (1.27 mmol) of $Lu_2O_3$, 1.0261 g (5.43 mmol) of LuN and 1.2479 g (8.91 mmol) of $Si_3N_4$ are ground intimately together in a mortar. The resultant mixture of the starting compounds is transferred into a boron nitride boat and calcined at 1600° C. for 8 h in an $N_2/H_2$ stream (10% forming gas). All manipulations of the starting materials are carried out in an $N_2$-filled glove box.

Example 14: $SrYAl_3SiN_4O_3$:10% $Eu^{2+}$ 0.1676 g (1.01 mmol) of EuN, 0.8814 g (3.03 mmol) of $Sr_3N_2$, 1.2420 g (30.30 mmol) of AlN, 1.1404 g (5.05 mmol) of $Y_2O_3$, 0.4552 g (7.58 mmol) of $SiO_2$ and 0.1181 g (0.84 mmol) of $Si_3N_4$ are ground intimately together in a mortar. The resultant mixture of the starting compounds is transferred into a boron nitride boat and calcined at 1600° C. for 8 h in an $N_2/H_2$ stream (10% forming gas). All manipulations of the starting materials are carried out in an $N_2$-filled glove box.

Example 15: $SrYAl_{1.5}Si_{2.5}N_{5.5}O_{1.5}$:16% $Eu^{2+}$ 0.3998 g (2.41 mmol) of EuN, 1.2261 g (4.22 mmol) of $Sr_3N_2$, 0.9256 g (22.58 mmol) of AlN, 1.6998 g (7.53 mmol) of $Y_2O_3$ and 1.7600 g (12.55 mmol) of $Si_3N_4$ are ground intimately together in a mortar. The resultant mixture of the starting compounds is transferred into a boron nitride boat and calcined at 1600° C. for 8 h in an $N_2/H_2$ stream (10% forming gas). All manipulations of the starting materials are carried out in an $N_2$-filled glove box.

In the case of all compounds from Examples 1 to 15, the X-ray powder diffraction patterns confirm that the compounds indicated are formed in phase-pure form.

Example 16: Measurement of the Luminescence Properties of the Phosphors from Examples 1 to 15

The luminescence properties of the compounds from Examples 1 to 15 are measured in order to determine the suitability of these compounds as phosphors for phosphor-converted LEDs. The results are summarised in Table 1. To this end, the luminescence quantum yield QA, the lumen equivalent LE, the colour point of the emission in CIE 1931 x/y colour coordinates, and for some samples the thermal quenching TQ are determined. The thermal quenching TQ is the temperature at which the intensity of the luminescence has dropped to half compared with the luminescence intensity extrapolated to 0 K.

TABLE 1

Luminescence properties of the phosphors according to the invention

| Example | Composition | QA | LE | Colour point | TQ |
|---|---|---|---|---|---|
| 2 | $Sr_{0.84}LuSi_{2.5}Al_{1.5}O_{1.5}N_{5.5}$:$Eu^{2+}$ (16%) | 32% | 456 lm/W | x: 0.373 y: 0.557 | 331 K |
| 4 | $Ba_{0.84}LuSi_{2.5}Al_{1.5}O_{1.5}N_{5.5}$:$Eu^{2+}$ (16%) | 47% | 464 lm/W | x: 0.332 y: 0.582 | |
| 5 | $Sr_{0.89}Ca_{0.10}LuSi_{2.5}Al_{1.5}O_{1.5}N_{5.5}$:$Eu^{2+}$ (1%) | 32% | 438 lm/W | x: 0.338 y: 0.560 | 342 K |
| 6 | $Sr_{0.89}Ba_{0.10}LuSi_{2.5}Al_{1.5}O_{1.5}N_{5.5}$:$Eu^{2+}$ (1%) | 48% | 438 lm/W | x: 0.319 y: 0.562 | 372 K |
| 7 | $Sr_{0.99}Y_{0.50}Lu_{0.50}Si_{2.5}Al_{1.5}O_{1.5}N_{5.5}$:$Eu^{2+}$ (1%) | 29% | 428 lm/W | x: 0.365 y: 0.554 | |
| 8 | $Sr_{0.84}Y_{0.75}Lu_{0.25}Si_{2.5}Al_{1.5}O_{1.5}N_{5.5}$:$Eu^{2+}$ (16%) | 19% | 396 lm/W | x: 0.432 y: 0.526 | |
| 9 | $Sr_{0.84}Y_{0.50}Lu_{0.50}Si_{2.5}Al_{1.5}O_{1.5}N_{5.5}$:$Eu^{2+}$ (16%) | 21% | 409 lm/W | x: 0.415 y: 0.535 | |
| 10 | $Sr_{0.84}Y_{0.25}Lu_{0.75}Si_{2.5}Al_{1.5}O_{1.5}N_{5.5}$:$Eu^{2+}$ (16%) | 28% | 463 lm/W | x: 0.337 y: 0.569 | |
| 11 | $Ba_{0.90}LuSi_{2.5}Al_{1.5}O_{1.5}N_{5.5}$:$Eu^{2+}$ (10%) | 41% | 450 lm/W | x: 0.307 y: 0.568 | 390 K |
| 12 | $Sr_{0.90}LuSi_{3.5}Al_{0.5}O_{0.5}N_{6.5}$:$Eu^{2+}$ (10%) | 32% | 435 lm/W | x: 0.346 y: 0.550 | 339 K |
| 13 | $Ba_{0.90}LuSi_{3.5}Al_{0.5}O_{0.5}N_{6.5}$:$Eu^{2+}$ (10%) | 19% | 439 lm/W | x: 0.307 y: 0.559 | 320 K |
| 14 | $Sr_{0.90}YSiAl_3O_3N_4$:$Eu^{2+}$ (10%) | 28% | 437 lm/W | x: 0.352 y: 0.552 | 338 K |
| 15 | $Sr_{0.84}YSi_{2.5}Al_{1.5}O_{1.5}N_{5.5}$:$Eu^{2+}$ (16%) | 13% | 415 lm/W | x: 0.447 y: 0.519 | 271 K |

Example 17

Production of a Pc-LED Using a Phosphor of the Composition $SrLuAl_{1.5}Si_{2.5}N_{5.5}O_{1.5}$:$Eu^{2+}$ (16%)

1.28 g of the phosphor having the composition $SrLuAl_{1.5}Si_{2.5}N_{5.5}O_{1.5}$: $Eu^{2+}$ (16%) from Example 2 are mixed with 8.72 g of an optically transparent silicone and subsequently mixed homogeneously in a planetary centrifugal mixer, so that the phosphor concentration in the overall composition is 12.8% by weight. The silicone/phosphor mixture obtained in this way is applied to the chip of a blue semiconductor LED with the aid of an automatic dispenser and cured with supply of heat. The blue semiconductor LEDs used for the LED characterisation in the present example have an emission wavelength of 450 nm and are operated at a current strength of 350 mA. The photometric characterisation of the LED is carried out using an Instrument Systems CAS 140 spectrometer and an ISP 250 integration sphere connected thereto. The LED is characterised via the determination of the wavelength-dependent spectral power density. The spectrum obtained in this way of the light emitted by the LED is used to calculate the colour point coordinates CIE x and y.

Example 18: Production of a Pc-LED Using a Phosphor of the Composition $BaLuAl_{1.5}Si_{2.5}N_{5.5}O_{1.5}$:$Eu^{2+}$ (16%)

0.95 g of the phosphor having the composition $BaLuAl_{1.5}Si_{2.5}N_{5.5}O_{1.5}$:$Eu^{2+}$ (16%) from Example 4 are mixed with 9.05 g of an optically transparent silicone and subsequently mixed homogeneously in a planetary centrifugal mixer, so that the phosphor concentration in the overall composition is 9.5% by weight. The silicone/phosphor mixture obtained in this way is applied to the chip of a near-UV semiconductor LED with the aid of an automatic dispenser and cured with supply of heat. The near-UV semiconductor LEDs used for the LED characterisation in the present example have an emission wavelength of 395 nm and are operated at a current strength of 350 mA. The photometric characterisation of the LED is carried out using an Instrument Systems CAS 140 spectrometer and an ISP 250 integration sphere connected thereto. The LED is characterised via the determination of the wavelength-dependent spectral power density. The spectrum obtained in this way of the light emitted by the LED is used to calculate the colour point coordinates CIE x and y.

Example 19: Production of a Pc-LED Using a Phosphor of the Composition $Sr_{0.84}YSi_{2.5}Al_{1.5}N_{5.5}O_{1.5}:Eu^{2+}$ (16%)

1.5 g of the phosphor having the composition $Sr_{0.84}YSi_{2.5}Al_{1.5}N_{5.5}O_{1.5}:Eu^{2+}$ (16%) from Example 15 are weighed out, mixed with 8.5 g of an optically transparent silicone and subsequently mixed homogeneously in a planetary centrifugal mixer, so that the phosphor concentration in the overall composition is 15% by weight. The silicone/phosphor mixture obtained in this way is applied to the chip of a near-UV semiconductor LED with the aid of an automatic dispenser and cured with supply of heat. The near-UV semiconductor LEDs used for the LED characterisation in the present example have an emission wavelength of 395 nm and are operated at a current strength of 350 mA. The photometric characterisation of the LED is carried out using an Instrument Systems CAS 140 spectrometer and an ISP 250 integration sphere connected thereto. The LED is characterised via the determination of the wavelength-dependent spectral power density. The spectrum obtained in this way of the light emitted by the LED is used to calculate the colour point coordinates CIE x and y.

Example 20: Production of a Pc-LED Using a Phosphor of the Composition $Sr_{0.9}YSiAl_3O_3N_4:Eu^{2+}$ (10%)

1.5 g of the phosphor having the composition $Sr_{0.9}YSiAl_3O_3N_4:Eu^{2+}$ (10%) from Example 14 are weighed out, mixed with 8.5 g of an optically transparent silicone and subsequently mixed homogeneously in a planetary centrifugal mixer, so that the phosphor concentration in the overall composition is 15% by weight. The silicone/phosphor mixture obtained in this way is applied to the chip of a near-UV semiconductor LED with the aid of an automatic dispenser and cured with supply of heat. The near-UV semiconductor LEDs used for the LED characterisation in the present example have an emission wavelength of 395 nm and are operated at a current strength of 350 mA. The photometric characterisation of the LED is carried out using an Instrument Systems CAS 140 spectrometer and an ISP 250 integration sphere connected thereto. The LED is characterised via the determination of the wavelength-dependent spectral power density. The spectrum obtained in this way of the light emitted by the LED is used to calculate the colour point coordinates CIE x and y.

Example 21: Production of a Pc-LED Using a Phosphor of the Composition $Sr_{0.9}LuSi_{3.5}Al_{0.5}O_{0.5}N_{6.5}:Eu^{2+}$ (10%)

1.5 g of the phosphor having the composition $Sr_{0.9}LuSi_{3.5}Al_{0.5}O_{0.5}N_{6.5}:Eu^{2+}$ (10%) from Example 12 are weighed out, mixed with 8.5 g of an optically transparent silicone and subsequently mixed homogeneously in a planetary centrifugal mixer, so that the phosphor concentration in the overall composition is 15% by weight. The silicone/phosphor mixture obtained in this way is applied to the chip of a near-UV semiconductor LED with the aid of an automatic dispenser and cured with supply of heat. The near-UV semiconductor LEDs used for the LED characterisation in the present example have an emission wavelength of 395 nm and are operated at a current strength of 350 mA. The photometric characterisation of the LED is carried out using an Instrument Systems CAS 140 spectrometer and an ISP 250 integration sphere connected thereto. The LED is characterised via the determination of the wavelength-dependent spectral power density. The spectrum obtained in this way of the light emitted by the LED is used to calculate the colour point coordinates CIE x and y.

Example 22: Production of a Pc-LED Using a Phosphor of the Composition $Ba_{0.9}LuSi_{3.5}Al_{0.5}O_{0.5}N_{6.5}:Eu^{2+}$ (10%)

1.5 g of the phosphor having the composition $Ba_{0.9}LuSi_{3.5}Al_{0.5}O_{0.5}N_{6.5}:Eu^{2+}$ (10%) from Example 13 are weighed out, mixed with 8.5 g of an optically transparent silicone and subsequently mixed homogeneously in a planetary centrifugal mixer, so that the phosphor concentration in the overall composition is 15% by weight. The silicone/phosphor mixture obtained in this way is applied to the chip of a near-UV semiconductor LED with the aid of an automatic dispenser and cured with supply of heat. The near-UV semiconductor LEDs used for the LED characterisation in the present example have an emission wavelength of 395 nm and are operated at a current strength of 350 mA. The photometric characterisation of the LED is carried out using an Instrument Systems CAS 140 spectrometer and an ISP 250 integration sphere connected thereto. The LED is characterised via the determination of the wavelength-dependent spectral power density. The spectrum obtained in this way of the light emitted by the LED is used to calculate the colour point coordinates CIE x and y.

The invention claimed is:
1. A compound of formula (1):

$$(EA)_{1-y}MSi_{4-x}Al_xN_{7-x}O_x:yEu^{2+} \qquad \text{formula (1)}$$

wherein

EA is Mg, Ca, Sr, or Ba or a mixture of two or more of the elements Mg, Ca, Sr and Ba;

M is Y, or Lu or a mixture of Y and Lu;

$0.004 \leq x \leq 3.0$;

$0 < y \leq 0.25$;

with the proviso that compounds of formula $SrYSi_{4-x}Al_xN_{7-x}O_x:y\ Eu^{2+}$ where $0.004 \leq x \leq 1.0$ are excluded from the invention.

2. The compound according to claim 1, which is of formula (2), $$(Mg_aCa_bSr_cBa_d)_{1-y}(Y_eLu_f)Si_{4-x}Al_xN_{7-x}O_x:yEu^{2+} \qquad \text{formula (2)}$$

where x and y have the meanings given for the compound of formula (1) and furthermore:

$0 \leq a \leq 1$;
$0 \leq b \leq 1$;
$0 \leq c \leq 1$;
$0 \leq d \leq 1$;
$a+b+c+d=1$;
$0 \leq e \leq 1$;
$0 \leq f \leq 1$;

e+f=1; and at least three of a, b, c, d, e and f are >0.

3. The compound according to claim 1, which is one of formulae (2a) to (2n), $(Mg_aCa_b)_{1-y}YSi_{4-x}Al_xN_{7-x}O_x:yEu^{2+}$      formula (2a)

$(Mg_aCa_b)_{1-y}LuSi_{4-x}Al_xN_{7-x}O_x:yEu^{2+}$      formula (2b)

$(Mg_aSr_c)_{1-y}YSi_{4-x}Al_xN_{7-x}O_x:yEu^{2+}$      formula (2c)

$(Mg_aSr_c)_{1-y}LuSi_{4-x}Al_xN_{7-x}O_x:yEu^{2+}$      formula (2d)

$(Ca_bSr_c)_{1-y}YSi_{4-x}Al_xN_{7-x}O_x:yEu^{2+}$      formula (2e)

$(Ca_bSr_c)_{1-y}LuSi_{4-x}Al_xN_{7-x}O_x:yEu^{2+}$      formula (2f)

$(Ca_bBa_d)_{1-y}YSi_{4-x}Al_xN_{7-x}O_x:yEu^{2+}$      formula (2g)

$(Ca_bBa_d)_{1-y}LuSi_{4-x}Al_xN_{7-x}O_x:yEu^{2+}$      formula (2h)

$(Sr_cBa_d)_{1-y}YSi_{4-x}Al_xN_{7-x}O_x:yEu^{2+}$      formula (2i)

$(Sr_cBa_d)_{1-y}LuSi_{4-x}Al_xN_{7-x}O_x:yEu^{2+}$      formula (2j)

$Mg_{1-y}(Y_dLu_e)Si_{4-x}Al_xN_{7-x}O_x:yEu^{2+}$      formula (2k)

$Ca_{1-y}(Y_eLu_f)Si_{4-x}Al_xN_{7-x}O_x:yEu^{2+}$      formula (2l)

$Sr_{1-y}(Y_eLu_f)Si_{4-x}Al_xN_{7-x}O_x:yEu^{2+}$      formula (2m)

$Ba_{1-y}(Y_eLu_f)Si_{4-x}Al_xN_{7-x}O_x:yEu^{2+}$      formula (2n)

where x and y have the meanings given for the compound of formula (1) and furthermore:

$0<a\leq1$;
$0<b\leq1$;
$0<c\leq1$;
$0<d\leq1$;
$0<e\leq1$;
$0<f\leq1$;

a+b=1 in formulae (2a) and (2b);
a+c=1 in formulae (2c) and (2d);
b+c=1 in formulae (2e) and (2f);
b+d=1 in formulae (2g) and (2h);
c+d=1 in formulae (2i) and (2j); and
e+f=1 in formulae (2k) to (2n).

4. The compound according to claim 3, wherein the Mg:Ca, Mg:Sr, Ca:Sr, Ca:Ba or Sr:Ba ratio, based on the molar amounts, in formulae (2a) to (2j) is between 50:1 and 1:50, and the Y:Lu ratio, based on the molar amounts, in the formulae (2k) to (2n) is between 50:1 and 1:50.

5. The compound according to claim 3, wherein the Mg:Ca, Mg:Sr, Ca:Sr, Ca:Ba or Sr:Ba ratio, based on the molar amounts, in formulae (2a) to (2j) is between 10:1 and 1:10, and the Y:Lu ratio, based on the molar amounts, in the formulae (2k) to (2n) is between 5:1 and 1:5.

6. The compound according to claim 1, which is one of formula (3), (4) or (5), $Mg_{1-y}MSi_{4-x}Al_xN_{7-x}O_x:yEu^{2+}$      formula (3)

$Ca_{1-y}MSi_{4-x}Al_xN_{7-x}O_x:yEu^{2+}$      formula (4)

$Ba_{1-y}MSi_{4-x}Al_xN_{7-x}O_x:yEu^{2+}$      formula (5)

where M, x and y have the meanings given for the compound of formula (1).

7. The compound according to claim 1, which is of formula (6), $(EA)_{1-y}LuSi_{4-x}Al_xN_{7-x}O_x:yEu^{2+}$      formula (6)

where EA, x and y have the meanings given for the compound of formula (1).

8. The compound according to claim 1, wherein $0.5 \leq x \leq 2.0$.

9. The compound according claim 1, wherein $0 < y \leq 0.20$.

10. A process for preparing the compound according to claim 1, comprising:

a) preparing a mixture of an Mg, Ca, Sr and/or Ba compound, a Y and/or Lu compound, an Si compound, an Al compound and an Eu compound, where at least one of these compounds is in the form of a nitride and at least one of these compounds is in the form of an oxide; and b) calcining the mixture under non-oxidizing conditions.

11. The compound according to claim 1, which has a coating on its the surface.

12. An emission-converting material comprising at least one compound according to claim 1 and optionally one or more further conversion phosphors.

13. A method for converting light in a light source, comprising achieving said conversion by a conversion phosphor comprising a compound according to claim 1.

14. The compound according to claim 1, wherein $1.3 \leq x \leq 1.7$.

15. The compound according claim 1, wherein $0.02 \leq y \leq 0.16$.

16. The compound according to claim 1, which has a metal oxide or a nitride coating on its surface.

17. An emission-converting material comprising at least one compound according to claim 1 and one or more further conversion phosphors.

18. A shaped body or ceramic comprising a compound of formula (1) or an emission-converting material comprising said compound and optionally comprising one or more further conversion phosphors $(EA)_{1-y}MSi_{4-x}Al_xN_{7-x}O_x:yEu^{2+}$      formula (1)

wherein

EA is Mg, Ca, Sr, or Ba or a mixture of two or more of the elements Mg, Ca, Sr and Ba;

M is Y, or Lu or a mixture of Y and Lu;

$0.004 \leq x \leq 3.0$;

$0 < y \leq 0.25$;

with the proviso that compounds of formula $SrYSi_{4-x}Al_xN_{7-x}O_x:y Eu^{2+}$ where $0.004 \leq x \leq 1.0$ are excluded from the invention.

19. A light source, comprising a primary light source and a at least one compound of formula (1) or an emission-converting material or a shaped body or ceramic comprising said compound and optionally comprising one or more further conversion phosphors $(EA)_{1-y}MSi_{4-x}Al_xN_{7-x}O_x:yEu^{2+}$      formula (1)

wherein

EA is Mg, Ca, Sr, or Ba or a mixture of two or more of the elements Mg, Ca, Sr and Ba;

M is Y, or Lu or a mixture of Y and Lu;

$0.004 \leq x \leq 3.0$;

$0 < y \leq 0.25$;

with the proviso that compounds of formula $SrYSi_{4-x}Al_xN_{7-x}O_x:y Eu^{2+}$ where $0.004 \leq x \leq 1.0$ are excluded from the invention.

20. A lighting unit comprising at least one light source according to claim 19.

* * * * *